US 9,052,567 B2

(12) United States Patent
Gutierrez

(10) Patent No.: US 9,052,567 B2
(45) Date of Patent: Jun. 9, 2015

(54) ACTUATOR INSIDE OF MOTION CONTROL

(75) Inventor: Roman C. Gutierrez, Arcadia, CA (US)

(73) Assignee: DigitalOptics Corporation MEMS, Arcadia, CA (US)

( * ) Notice: Subject to any disclaimer, the term of this patent is extended or adjusted under 35 U.S.C. 154(b) by 244 days.

(21) Appl. No.: 12/946,543

(22) Filed: Nov. 15, 2010

(65) Prior Publication Data

US 2012/0120297 A1    May 17, 2012

(51) Int. Cl.
| | |
|---|---|
| *G03B 13/00* | (2006.01) |
| *H04N 5/225* | (2006.01) |
| *G03B 5/00* | (2006.01) |
| *G02B 27/64* | (2006.01) |
| *G03B 3/10* | (2006.01) |

(52) U.S. Cl.
CPC ............. *G03B 5/00* (2013.01); *Y10T 29/49826* (2015.01); *G02B 27/646* (2013.01); *G03B 3/10* (2013.01); *G03B 2205/0007* (2013.01); *G03B 2205/0084* (2013.01)

(58) Field of Classification Search
CPC ............. G03B 2205/0084; G03B 5/00; G03B 2205/0061; H04N 5/2254
USPC ............... 348/374, 335, 207.99, 208.99, 345; 348/240.99; 310/309
See application file for complete search history.

(56) References Cited

U.S. PATENT DOCUMENTS

| | | |
|---|---|---|
| 2,774,001 A | 12/1956 | Riedel |
| 4,333,722 A | 6/1982 | Lee |
| 4,384,778 A | 5/1983 | Lee et al. |
| 4,408,857 A | 10/1983 | Frank |
| 4,496,217 A | 1/1985 | Aoyagi |
| 4,716,432 A | 12/1987 | Stephany |
| 4,860,040 A | 8/1989 | Tamamura et al. |
| 5,150,260 A | 9/1992 | Chigira |
| 5,386,294 A | 1/1995 | Ototake et al. |
| 5,699,621 A | 12/1997 | Trumper et al. |
| 5,825,560 A | 10/1998 | Ogura et al. |
| 5,867,302 A | 2/1999 | Fleming |
| 5,986,826 A | 11/1999 | Kosaka et al. |
| 5,995,688 A | 11/1999 | Aksyuk et al. |
| 6,033,131 A | 3/2000 | Ghosh |
| 6,068,801 A | 5/2000 | Bodo et al. |

(Continued)

FOREIGN PATENT DOCUMENTS

| | | |
|---|---|---|
| EP | 1959284 | 8/2008 |
| EP | 2264507 | 12/2010 |

(Continued)

OTHER PUBLICATIONS

Tsuboi, O, et al., "A Rotational Comb-Driven Micromirror with a Large Deflection Angle and Low Drive Voltage," Technical Digest. MEMS, IEEE International Conference on Microelectro Mechanical Systems, Jan. 20, 2002, pp. 532-535.

(Continued)

*Primary Examiner* — Ahmed A Berhan
(74) *Attorney, Agent, or Firm* — Haynes and Boone LLP

(57) ABSTRACT

A device can comprise an outer frame, a platform, and a motion control mechanism. The motion control mechanism can be adapted to permit movement of the platform in a desired direction with respect to the outer frame and inhibit rotation of the platform with respect to the outer frame. An actuator can be contained at least partially within the motion control mechanism.

22 Claims, 30 Drawing Sheets

(56) References Cited

U.S. PATENT DOCUMENTS

| | | | |
|---|---|---|---|
| 6,160,959 A * | 12/2000 | Mizumoto | 396/55 |
| 6,205,267 B1 | 3/2001 | Aksyuk et al. | |
| 6,239,473 B1 | 5/2001 | Adams | |
| 6,262,827 B1 | 7/2001 | Ueda et al. | |
| 6,291,875 B1 | 9/2001 | Clark | |
| 6,392,703 B1 | 5/2002 | Uchino et al. | |
| 6,426,777 B1 | 7/2002 | Sato | |
| 6,497,141 B1 | 12/2002 | Turner et al. | |
| 6,535,311 B1 | 3/2003 | Lindquist | |
| 6,675,671 B1 | 1/2004 | Jokiel, Jr. et al. | |
| 6,679,055 B1 | 1/2004 | Ellis | |
| 6,806,991 B1 | 10/2004 | Sarkar | |
| 6,847,907 B1 | 1/2005 | Novotny | |
| 6,850,675 B1 | 2/2005 | Calvet et al. | |
| 6,914,635 B2 | 7/2005 | Ostergard | |
| 6,950,570 B1 | 9/2005 | Novotny | |
| 6,958,777 B1 | 10/2005 | Pine | |
| 7,027,206 B2 | 4/2006 | Mochizuki | |
| 7,038,150 B1 | 5/2006 | Polosky et al. | |
| 7,113,688 B2 | 9/2006 | Calvet et al. | |
| 7,148,603 B1 | 12/2006 | Garcia | |
| 7,154,199 B2 | 12/2006 | Yasuda | |
| 7,190,854 B1 | 3/2007 | Novotny | |
| 7,266,272 B1 | 9/2007 | Calvet et al. | |
| 7,285,879 B2 | 10/2007 | Osaka | |
| 7,359,131 B1 | 4/2008 | Gutierrez et al. | |
| 7,372,074 B2 | 5/2008 | Milne et al. | |
| 7,436,207 B2 | 10/2008 | Rogers et al. | |
| 7,477,842 B2 | 1/2009 | Gutierrez | |
| 7,545,591 B1 | 6/2009 | Tong et al. | |
| 7,555,210 B2 | 6/2009 | Calvet | |
| 7,557,470 B2 | 7/2009 | Culpepper et al. | |
| 7,579,848 B2 | 8/2009 | Bottoms et al. | |
| 7,586,702 B1 | 9/2009 | Huang et al. | |
| 7,645,627 B2 | 1/2010 | Christenson | |
| 7,646,969 B2 | 1/2010 | Calvet et al. | |
| 7,705,909 B2 | 4/2010 | Ishizawa et al. | |
| 7,720,366 B2 | 5/2010 | Iwasaki et al. | |
| 7,838,322 B1 | 11/2010 | Vargo | |
| 7,855,489 B2 | 12/2010 | Hirano | |
| 7,872,394 B1 | 1/2011 | Gritters et al. | |
| 7,986,449 B2 * | 7/2011 | Davis et al. | 359/224.1 |
| 7,990,628 B1 | 8/2011 | Calvet et al. | |
| 8,004,780 B2 | 8/2011 | Gutierrez et al. | |
| 8,178,936 B2 | 5/2012 | Zhe et al. | |
| 8,299,598 B2 | 10/2012 | Moden | |
| 2001/0004420 A1 | 6/2001 | Kuwana et al. | |
| 2002/0006687 A1 | 1/2002 | Lam | |
| 2002/0070634 A1 | 6/2002 | Tai et al. | |
| 2002/0105699 A1 | 8/2002 | Miracky et al. | |
| 2002/0125789 A1 | 9/2002 | Brandt | |
| 2002/0130586 A1 | 9/2002 | Mao | |
| 2003/0026547 A1 | 2/2003 | Trzecieski | |
| 2003/0048036 A1 | 3/2003 | Lemkin | |
| 2003/0062422 A1 | 4/2003 | Fateley et al. | |
| 2003/0063838 A1 | 4/2003 | Hagood | |
| 2003/0076421 A1 | 4/2003 | Dutta | |
| 2003/0086751 A1 | 5/2003 | Culpepper | |
| 2003/0210116 A1 | 11/2003 | Lane et al. | |
| 2004/0048410 A1 | 3/2004 | O'Brien et al. | |
| 2004/0066494 A1 | 4/2004 | Lee et al. | |
| 2004/0136680 A1 | 7/2004 | Medina | |
| 2004/0183936 A1 | 9/2004 | Kim et al. | |
| 2004/0184132 A1 | 9/2004 | Novotny | |
| 2004/0189969 A1 | 9/2004 | Mizuno | |
| 2004/0201773 A1 | 10/2004 | Ostergard | |
| 2005/0000311 A1 | 1/2005 | Storm | |
| 2005/0002008 A1 | 1/2005 | De Weerdt et al. | |
| 2005/0002086 A1 | 1/2005 | Starkweather et al. | |
| 2005/0007489 A1 | 1/2005 | Ahn et al. | |
| 2005/0095813 A1 | 5/2005 | Zhu et al. | |
| 2005/0139542 A1 | 6/2005 | Dickensheets et al. | |
| 2005/0148433 A1 | 7/2005 | Wang et al. | |
| 2005/0156481 A1 * | 7/2005 | Zhou et al. | 310/309 |
| 2005/0219399 A1 | 10/2005 | Sato et al. | |
| 2005/0249487 A1 | 11/2005 | Gutierrez | |
| 2006/0028320 A1 | 2/2006 | Osaka | |
| 2006/0033938 A1 | 2/2006 | Kopf et al. | |
| 2006/0056084 A1 | 3/2006 | Araki | |
| 2006/0092514 A1 | 5/2006 | Koo | |
| 2006/0153556 A1 | 7/2006 | Lee et al. | |
| 2006/0183332 A1 | 8/2006 | Kang | |
| 2006/0192858 A1 | 8/2006 | Calvet | |
| 2006/0193618 A1 | 8/2006 | Calvet | |
| 2006/0204242 A1 | 9/2006 | Gutierrez et al. | |
| 2006/0209012 A1 | 9/2006 | Hagood, IV | |
| 2006/0219006 A1 | 10/2006 | Nasiri et al. | |
| 2006/0250325 A1 | 11/2006 | Hagood et al. | |
| 2006/0252297 A1 | 11/2006 | Culpepper | |
| 2006/0277997 A1 | 12/2006 | Foster | |
| 2007/0024155 A1 | 2/2007 | Calvet | |
| 2007/0133976 A1 | 6/2007 | Gutierrez | |
| 2008/0020573 A1 | 1/2008 | Birkmeyer et al. | |
| 2008/0044172 A1 | 2/2008 | Tang et al. | |
| 2008/0054757 A1 | 3/2008 | Aksyuk | |
| 2008/0198249 A1 | 8/2008 | Tanimura et al. | |
| 2008/0240704 A1 | 10/2008 | Takahashi | |
| 2008/0279498 A1 | 11/2008 | Sampsell et al. | |
| 2008/0309191 A1 | 12/2008 | Chou | |
| 2009/0031548 A1 | 2/2009 | Zaitsu | |
| 2009/0185796 A1 * | 7/2009 | Tsutsumi et al. | 396/55 |
| 2009/0213236 A1 | 8/2009 | Chiou | |
| 2009/0244302 A1 | 10/2009 | Tsai | |
| 2009/0244668 A1 | 10/2009 | Fujino | |
| 2009/0284816 A1 * | 11/2009 | Davis et al. | 359/199.1 |
| 2009/0310959 A1 | 12/2009 | Shih et al. | |
| 2010/0232777 A1 | 9/2010 | Tseng et al. | |
| 2010/0284081 A1 | 11/2010 | Gutierrez | |
| 2011/0026148 A1 | 2/2011 | Tanimura et al. | |

FOREIGN PATENT DOCUMENTS

| | | |
|---|---|---|
| JP | 2006-297543 | 11/2006 |
| JP | 2008-010624 | 1/2008 |
| JP | 2010-145264 | 7/2010 |
| JP | 2010-167536 | 8/2010 |
| KR | 2008/0079115 | 8/2008 |
| WO | WO02/063371 | 8/2002 |
| WO | WO2008/061025 | 5/2008 |
| WO | WO2010/038229 | 4/2010 |

OTHER PUBLICATIONS

Yi, Chu, et al., "Design, Fabrication and Control of Components in MEMS-Based Optical Pickups," IEEE Transactions on Magnetics, IEEE Service Center, New York, US, vol. 17, No. 2, Feb. 1, 2007, pp. 780-784.

Minching, Wu, et al., "Development of Tracking and Focusing Micro Actuators for Dual-Stage Optical Pick-Up Head," Journal of Optics. A, Pure and Applied Optics, Institute of Physics Publishing, Bristol, GB, vol. 8, No. 7, Jul. 1, 2006, pp. S323-S329.

Seong-Hyok Kim, et al., Integrated Micro Optical Flying Head with Lens Positioning Actuator for Small Form Factor Data Storage, Transducers '03. 12$^{th}$ International Conference on Solid-State Sensors, Actuators and Microsystems. Digest of Technical Papers (Cat. No. 03TH8664), vol. 1, Jan. 1, 2003, pp. 607-610.

Sunghoon, Kwon, et al., "Large Displacement Vertical Microlens Scanner wit Low Driving Voltage," IEEE Photonics Technology Letters, IEEE Service Center, Piscataway, NJ, US, vol. 14, No. 11, Nov. 1, 2002.

PCT Search Report for PCT Application No. PCT/US2011/059435 mailed Mar. 16, 2012.

PCT/US 06/07024 Search Report of Nov. 28, 2007.

Akihiro Koga et al. "Electrostatic Linear Microactuator Mechanism for Focusing a CCD Camera"; Journal of Lightwave Technology, vol. 17, No. 1: p. 43-47; Jan. 1999.

Takahashi, K., et al.; "Switched-Layer Design for SOI Bulk Micromachined XYZ Stage Using Stiction Bar for Interlayer Electrical Connection," Journal of Microelectromechanical Systems, IEEE Service Center, US, vol. 18, No. 4, pp. 818-827, Aug. 1, 2009.

* cited by examiner

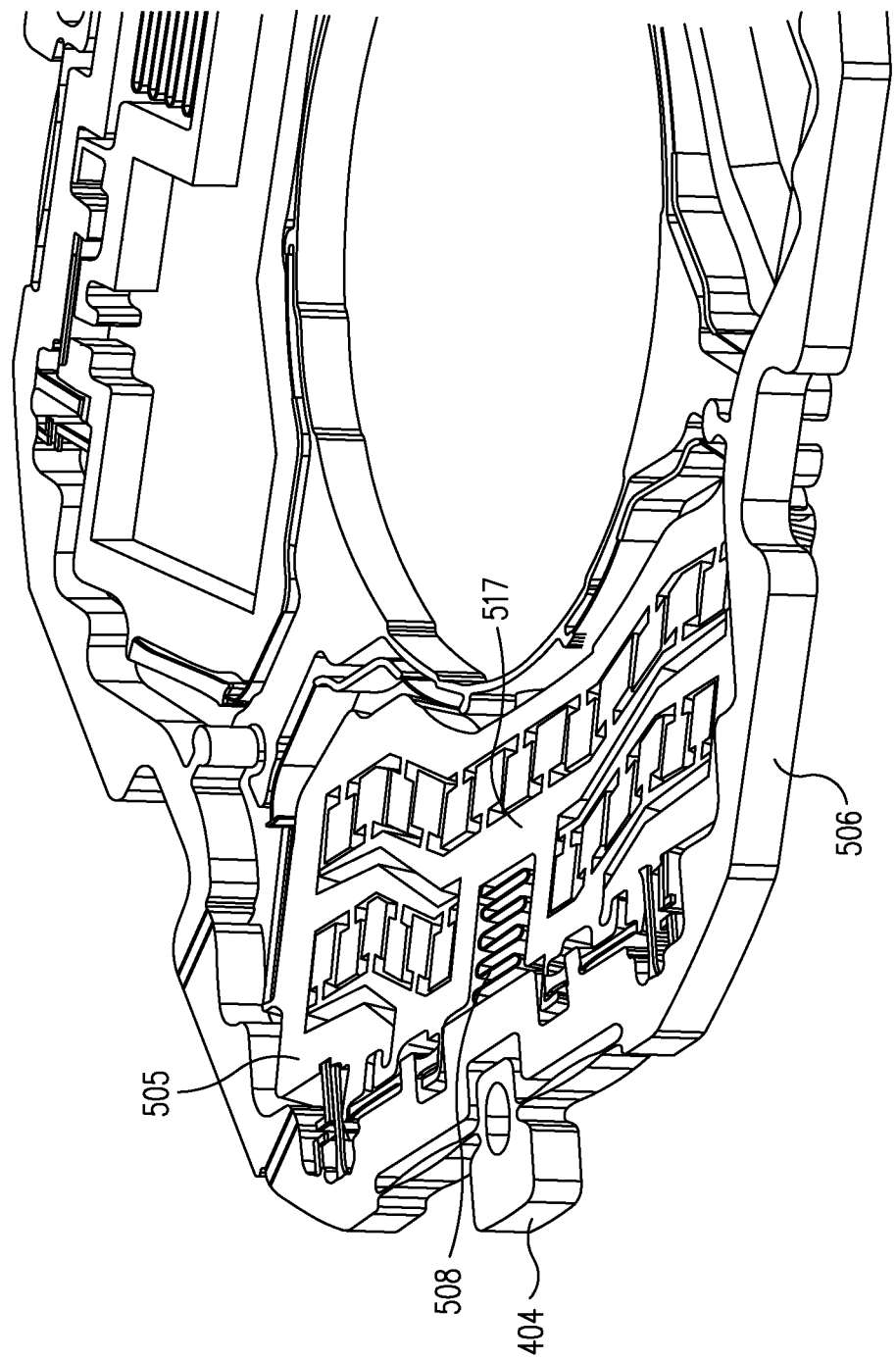

ACTUATOR INSIDE OF MOTION CONTROL

BACKGROUND

1. Technical Field

This disclosure generally relates to actuators and more particularly relates, for example, to MEMS actuators with motion control that are suitable for use in miniature cameras or other devices.

2. Related Art

Actuators for use in miniature cameras and other devices are well known. Such actuators typically comprise voice coils that are used to move a lens for focusing, zooming, or optical image stabilization.

Miniature cameras are used in a variety of different electronic devices. For example, miniature cameras are commonly used in cellular telephones, laptop computers, and surveillance devices. Miniature cameras may have many other applications.

It is frequently desirable to reduce the size of miniature cameras. As the size of electronic devices continues to be reduced, the size of miniature cameras that are part of such electronic devices must typically be reduced as well.

Further, it is desirable to enhance the shock resistance of such miniature cameras. As the size of miniature cameras is reduced, smaller, more delicate components must often be utilized in their construction. Since such consumer products are typically subject to substantial abuse, such as rough handling and dropping, the components of miniature cameras must be protected from the shock that is associated with such abuse.

SUMMARY

According to an embodiment, a device can comprise an outer frame, a platform, and a motion control mechanism. The motion control mechanism can be adapted to permit movement of the platform in a desired direction with respect to the outer frame and inhibit rotation of the platform with respect to the outer frame. An actuator can be contained at least partially within the motion control mechanism.

According to an embodiment, a system can comprise an outer frame, a platform, an optical element attached to the platform, and a motion control mechanism. The motion control mechanism can be adapted to permit movement of the optical element in a desired direction with respect to the outer frame and inhibit rotation of the optical with respect to the outer frame. An actuator can be contained at least partially within the motion control mechanism.

According to an embodiment, a method can comprise forming an outer frame, forming a platform, and forming a motion control mechanism adapted to permit movement of the platform in a desired direction with respect to the outer frame and inhibit rotation of the platform with respect to the outer frame. An actuator can be formed at least partially within the motion control mechanism.

According to an embodiment, a method can comprise permitting movement of a platform in a desired direction with respect to the outer frame and inhibiting rotation of the platform with respect to the outer frame using a motion control mechanism. The platform can be moved with an actuator contained at least partially within the motion control mechanism.

The scope of the disclosure is defined by the claims, which are incorporated into this section by reference. A more complete understanding of embodiments will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE FIGURES

FIG. 9C illustrates a portion of the actuator device in a deployed configuration with a maximum voltage applied thereto, in accordance with an embodiment.

Embodiments of the disclosure and their advantages are best understood by referring to the detailed description that follows. It should be appreciated that like reference numerals are used to identify like elements illustrated in one or more of the figures.

DETAILED DESCRIPTION

Figure 1:
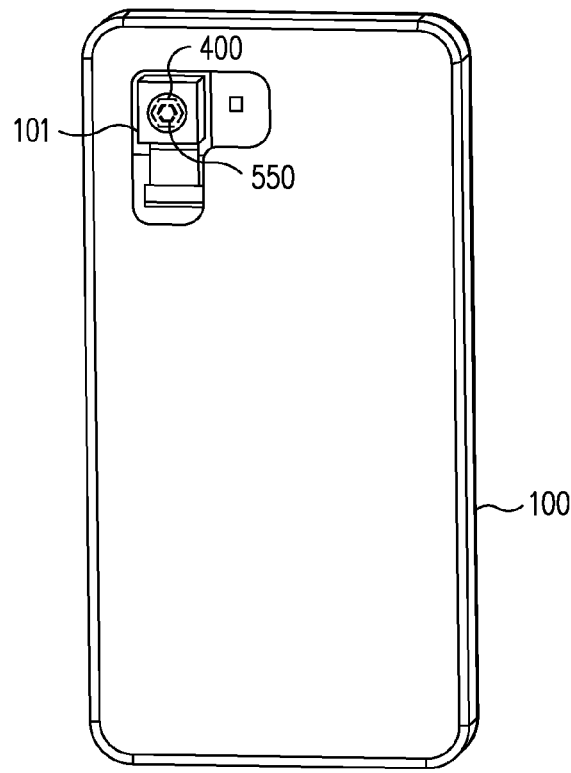
FIG. 1 illustrates an electronic device having an actuator device, in accordance with an embodiment.

An actuator device suitable for use in a wide variety of different electronic devices is disclosed in accordance with various embodiments. The actuator device may be adapted for use in a camera, such as a miniature camera, for example. The actuator device may be used to either manually or automatically focus the miniature camera. The actuator device may be used to zoom the miniature camera or to provide optical image stabilization for the miniature camera. The actuator device may be used to align the optics within the camera. The actuator device may be used for any other desired application in an electronic device or in any other device.

In accordance with one or more embodiments, the actuator device may comprise one or more MEMS actuators. The actuator device may be formed using monolithic construction. The actuator device may be formed using non-monolithic construction.

The actuator device may be formed using contemporary fabrication techniques, such as etching and micromachining, for example. Various other fabrication techniques are contemplated.

The actuator device may be formed of silicon (e.g., single crystal silicon and/or polycrystalline silicon). The actuator device may be formed of other semiconductors such as silicon, germanium, diamond, and gallium arsenide. The material of which the actuator device is formed may be doped to obtain a desired conductivity thereof. The actuator device may be formed of a metal such as tungsten, titanium, germanium, aluminum, or nickel. Any desired combination of such materials may be used.

Motion control of the actuator device and/or items moved by the actuator device is disclosed in accordance with various embodiments. The motion control may be used to facilitate a desired movement of an item while mitigating undesired movement of the item. For example, the motion control may be used to facilitate movement of a lens along an optical axis of the lens, while inhibiting other movements of the lens. Thus, the motion control may be used to facilitate movement of the lens in single desired translational degree of freedom while inhibiting movement of the lens in all other translational degrees of freedom and while inhibiting movement of the lens in all rotational degrees of freedom. In another example, the motion control may facilitate movement of the lens in all three translational degrees of freedom while inhibiting movement of the lens in all rotational degrees of freedom.

Thus, an enhanced miniature camera for standalone use and for use in electronic devices may be provided. The miniature camera is suitable for use in a wide variety of different electronic devices. For example, the miniature camera is suitable for use in electronic devices such as cellular telephones, laptop computers, televisions, handheld devices, and surveillance devices.

According to various embodiments, smaller size and enhanced shock resistance are provided. Enhanced fabrication techniques may be used to provide these and other advantages. Such fabrication techniques may additionally enhance the overall quality and reliability of miniature cameras while also substantially reducing the cost thereof.

FIG. 1 illustrates an electronic device 100 having an actuator device 400, in accordance with an embodiment. As discussed herein, the actuator device 400 may have one or more actuators 550. In one embodiment, the actuators 550 may be MEMS actuators, such as electrostatic comb drive actuators. In one embodiment, the actuators 550 may be rotational comb drive actuators.

The electronic device 100 may have one or more actuators 550 for moving any desired component thereof. For example, the electronic device 100 may have an optical device such as a miniature camera 101 that has the actuator 550 for moving optical elements such as one or more movable lenses 301 (shown in FIG. 2) that are adapted to provide focus, zoom, and/or image stabilization. The electronic device 100 may have any desired number of the actuators 550 for performing any desired functions.

The electronic device 100 may be a cellular telephone, a laptop computer, a surveillance device, or any other desired device. The miniature camera 101 may be built into the electronic device 100, may be attached to the electronic device 100, or may be separate (e.g., remote) with respect to the electronic device 100.

Figure 2:
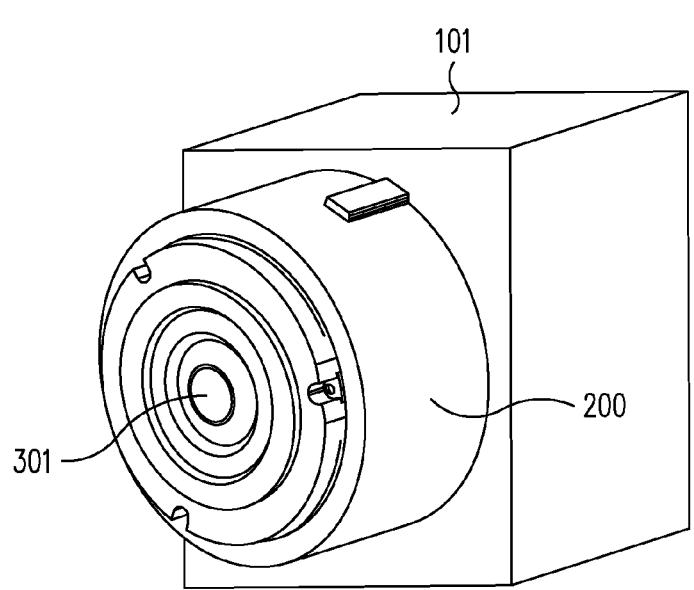
FIG. 2 illustrates a miniature camera having a lens barrel, in accordance with an embodiment.

FIG. 2 illustrates the miniature camera 101 having a lens barrel 200, in accordance with an embodiment. The lens barrel 200 may contain one or more optical elements, such as the movable lens 301, which may be moved by the actuator device 400 (shown in FIG. 1). The lens barrel 200 may have one or more optical elements which may be fixed. For example, the lens barrel 200 may contain one or more lenses, apertures (variable or fixed), shutters, mirrors (which may be flat, non-flat, powered, or non-powered), prisms, spatial light modulators, diffraction gratings, lasers, LEDs and/or detectors. Any of these items may be fixed or may be movable by the actuator device 400.

The actuator device 400 may move non-optical devices such as samples that are provided for scanning. The samples may be either biological samples or non-biological samples. Examples of biological samples include organisms, tissues, cells, and proteins. Examples of non-biological samples include solids, liquids, and gases. The actuator device 400 may be used to manipulate structures, light, sound, or any other desired thing.

The optical elements may be partially or fully contained within the lens barrel 200. The lens barrel 200 may have any desired shape, For example, the lens barrel 200 may be substantially round, triangular, rectangular, square, pentagonal, hexagonal, octagonal, or of any other shape or cross-sectional configuration. The lens barrel 200 may be either permanently or removably attached to the miniature camera 101. The lens barrel 200 may be defined by a portion of a housing of the miniature camera 101. The lens barrel 200 may be partially or completely disposed within the miniature camera 101.

Figure 3A:
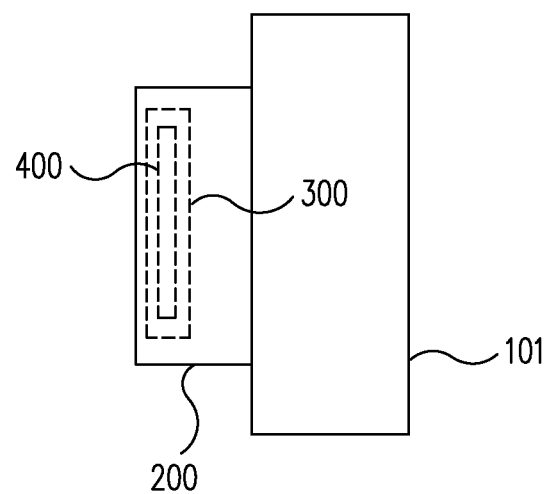
FIG. 3A illustrates the lens barrel having an actuator module disposed therein, in accordance with an embodiment.

FIG. 3A illustrates an actuator module 300 disposed within the lens barrel 200, in accordance with an embodiment. The actuator module 300 may contain the actuator device 400. The actuator device 400 may be completely contained within the lens barrel 200, partially contained within the lens barrel 200, or completely outside of the lens barrel 200. The actuator device 400 may be adapted to move optical elements contained within the lens barrel 200, optical elements not contained within the lens barrel 200, and/or any other desired items.

Figure 3B:
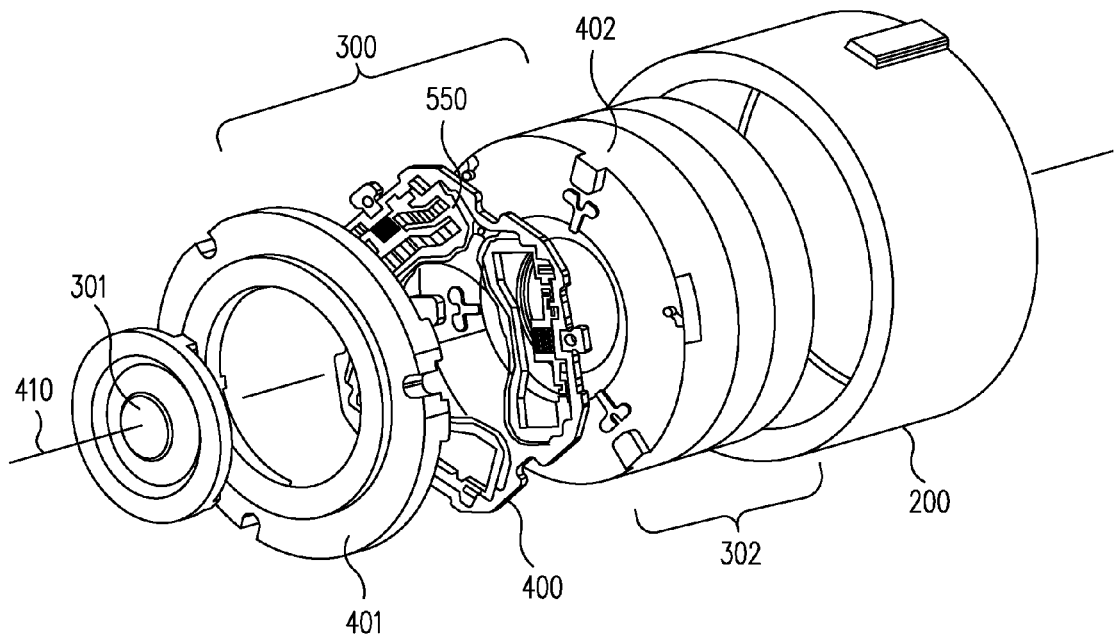
FIG. 3B illustrates the lens barrel and an actuator module in an exploded view, in accordance with an embodiment.

FIG. 3B illustrates the lens barrel 200 and the actuator module 300 in an exploded view, in accordance with an embodiment. The movable lens 301 is an example of an optical element that may be attached to the actuator device 400 and may be moved thereby. The actuator device 400 may be disposed intermediate an upper module cover 401 and a lower module cover 402.

Additional optical elements, such as fixed (e.g., stationary) lenses 302 may be provided. The additional optical elements may facilitate focus, zoom, and/or optical image stabilization, for example. Any desired number and/or type of movable (such as via the actuator device 400) and fixed optical elements may be provided.

Figure 4:
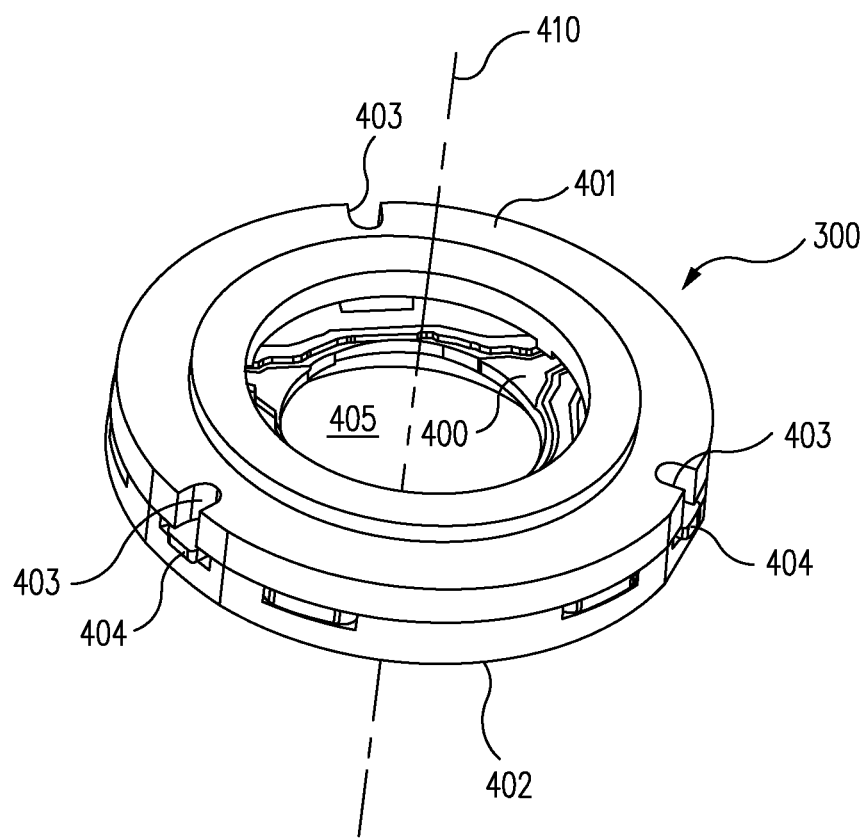
FIG. 4 illustrates the actuator module having the actuator device disposed therein, in accordance with an embodiment.

FIG. 4 illustrates the actuator module 300, in accordance with an embodiment. The actuator module 300 may be disposed partially or completely within the miniature camera 101. The actuator device 400 may be disposed partially or completely within the actuator module 300. For example, the actuator device 400 may be sandwiched substantially between an upper module cover 401 and a lower module cover 402.

The actuator module 300 may have any desired shape. For example, the actuator module 300 may be substantially round, triangular, square, rectangular, pentagonal, hexagonal, octagonal, or of any other shape or cross-sectional configuration.

In one embodiment, the lens barrel 200 may be substantially round in cross-sectional configuration and the actuator module 300 may be substantially round in cross-sectional configuration. The use of a substantially round lens barrel 200 and a substantially round actuator module 300 may facilitate an advantageous reduction in size. The reduction in size may be facilitated, for example, because round lenses are commonly preferred. The use of a substantially round lens barrel 200 and a substantially round actuator module 300 with round lenses tends to result in a reduction of wasted volume and thus tends to facilitate a reduction in size.

As discussed herein, one or more optical elements, such as the movable lens 301, may be disposed in an opening 405 (e.g., a hole) formed in the actuator module 300. Actuation of the actuators 550 may effect movement of the optical elements along their optical axis 410, for example. Thus, actuation of the actuators 550 may move one or more lenses to effect focusing or zoom, for example.

The actuator module 300 may have cutouts 403 formed therein to facilitate assembly of the actuator module 300 and alignment of the actuator device 400 contained therein. The cutouts 403 and/or electrical contacts 404 partially disposed within the cutouts 403 may be used to facilitate alignment of the actuator module 300 with respect to the lens barrel 200.

Figure 5A:
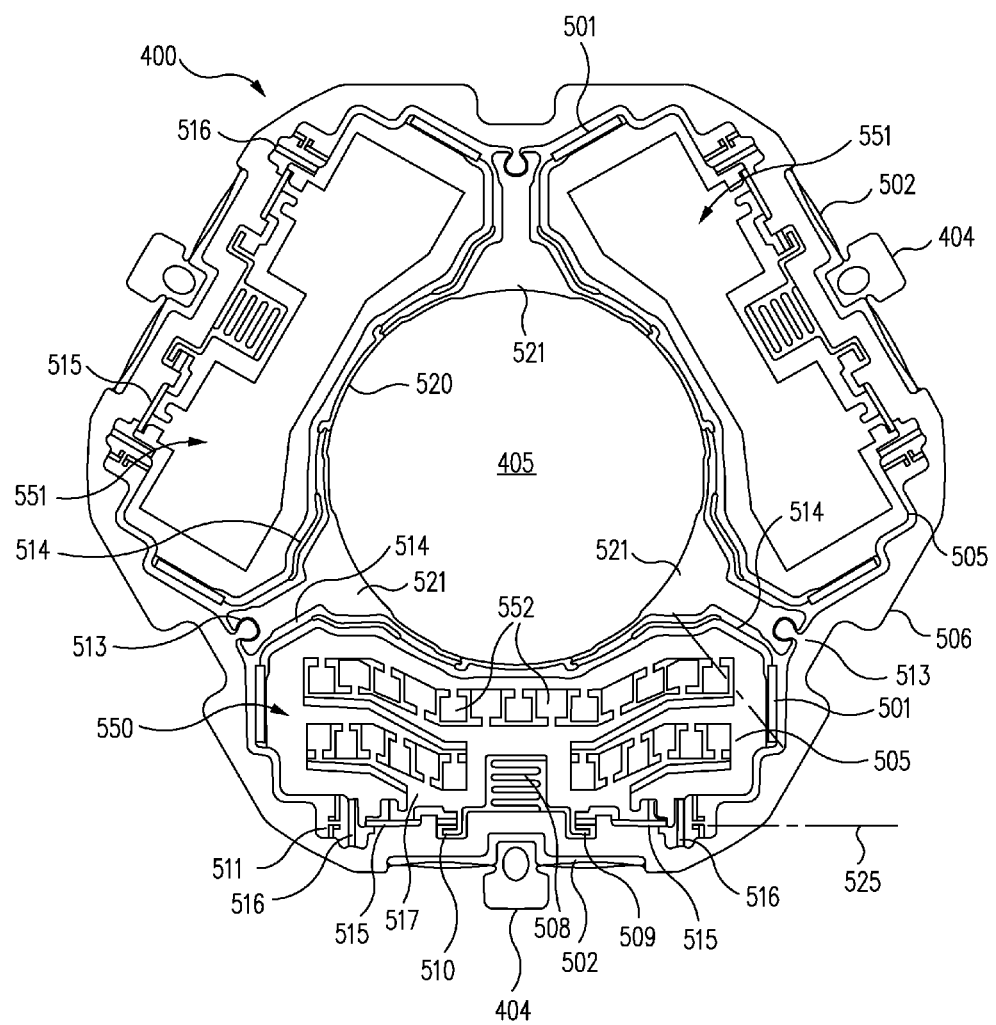
FIG. 5A illustrates a top view of the actuator device, in accordance with an embodiment.

FIG. 5A illustrates a top view of the actuator device 400 having the electrical contacts 404, the opening 405, inner hinge flexures 501, kinematic mount flexures 502, movable frames 505, an outer frame 506, serpentine contact flexures 508, deployment torsional flexures 509, deployment stops 510, flap dampers 511, ball-in-socket snubbers 513, cantilever flexures 514, motion control torsional flexures 515, outer hinge flexures 516, a fixed frame 517, a platform 520, lens pads 521, a pivot axis 525, the actuators 550, spaces 551, and blocks 552, in accordance with an embodiment.

Blocks 552 (FIG. 5A) are shown to represent teeth 560 (see FIGS. 5B and 7) of the actuator 550 in some figures. Those skilled in the art will appreciate that comb drives typically comprise a large number of very small teeth 560 that are difficult to show graphically on a drawing of this scale. For example, the actuator 550 may have between 1 and 10,000 teeth on each side thereof and may have approximately 2,000 teeth on each side thereof. Thus, in one embodiment, the blocks 552 may not represent the actual configuration of the teeth 560, but rather are shown in place of the teeth 560 to better illustrate the operation of the actuators 550, as discussed herein.

In accordance with an embodiment, the actuator device 400 may be substantially hexagonal in shape. The hexagonal shape readily facilitates placement of the actuator device 400 within the substantially round lens barrel 200. The hexagonal shape also facilitates efficient use of wafer real estate. Other shapes are contemplated.

The actuator device 400 may have a plurality of the actuators 550. Only one actuator 550 is illustrated in detail in FIG. 5A. The spaces 551 are shown in FIG. 5A for two additional actuators 550 that are not illustrated in detail. Thus, in one embodiment the actuator device 400 may have three actuators 550 disposed in a substantially radially symmetric pattern about the opening 405 such that the actuators 550 are spaced approximately 120° apart from one another. The actuator device 400 may have any desired number of the actuators 550 disposed in any desired pattern. As further examples, the actuator device 400 may have two actuators 550 spaced approximately 180° apart from one another or may have four actuators 550 spaced approximately 90° apart from one another.

As discussed herein, the actuators 550 may include one or more MEMS actuators, voice coil actuators, or any other desired type or combination of types of actuators. For example, in one embodiment, each actuator 550 may be a vertical rotational comb drive.

The actuators 550 may cooperate with one another to move a platform 520 along the optical axis 410 (FIG. 3B), which in FIG. 5A is perpendicular to the plane of the actuator device 400. The actuators 550 may cooperate with one another to move the platform 520 in a manner that maintains the platform 520 substantially orthogonal with respect to the optical axis 410 and in a manner that substantially mitigates rotation of the platform 520.

Actuation of the actuators 550 is accomplished by the application of a voltage differential between adjacent teeth 560, represented by blocks 552. Such actuation effects rotation of the actuators 550 to facilitate the herein described movement of the platform 520.

In various embodiments, the platform 520 may be adapted substantially as a ring (e.g., as shown in FIG. 5A). Other shapes are contemplated. The platform 520 may have any desired shape.

Prior to deployment, the actuator device 400 may be a substantially planar structure. For example, the actuator device 400 may be substantially formed from a single, monolithic piece of material, such as silicon. The actuator device 400 may be formed from a single die. The die may be approximately 4 to 5 millimeters across and approximately 150 microns thick, for example.

The actuator device 400 may be formed by a MEMS technique, such as milling or etching. A plurality of actuator devices 400 may be formed upon a single wafer. The overall shape or footprint of the actuator device 400 may be adapted to enhance the formation of a plurality of the actuator devices 400 on a single wafer.

Prior to operation, the fixed frame 517 of each actuator 550 may be deployed to offset the adjacent pairs of teeth 560 represented by blocks 552 with respect to one another, in accordance with an embodiment. Deployment may result in a substantially non-planar overall configuration of the actuator device 400. When deployed, each actuator 550 may have a portion thereof (e.g., the fixed frame 517) extending from the plane of the outer frame 506. The fixed frame 517 may extend from the plane of the outer frame 506 at an angle with respect thereto. Thus, when deployed, the fixed frame 517 may be substantially out-of-plane with respect to the outer frame 506.

Once deployed, the fixed frames 517 may be fixed or locked into position such that they do not move further with respect to the outer frame 506, and are angularly offset or rotated with respect to the outer frame 506 and with respect to the movable frame 505 (when the actuator 550 is not actuated). The fixed frames 517 may be mechanically fixed in position, adhesively bonded in position, or any desired combination of mechanically fixed and adhesively bonded.

Actuation of the actuator 550 may cause the movable frame 505 to rotate toward the deployed fixed frame 517 to effect desired movement of the platform 520. Motion control torsional flexures 515 and outer hinge flexures 516 cooperate to facilitate motion controlled rotation of the movable frame 505, as discussed herein. The movable frame 505 rotates about the pivot axis 525.

Figure 5B:
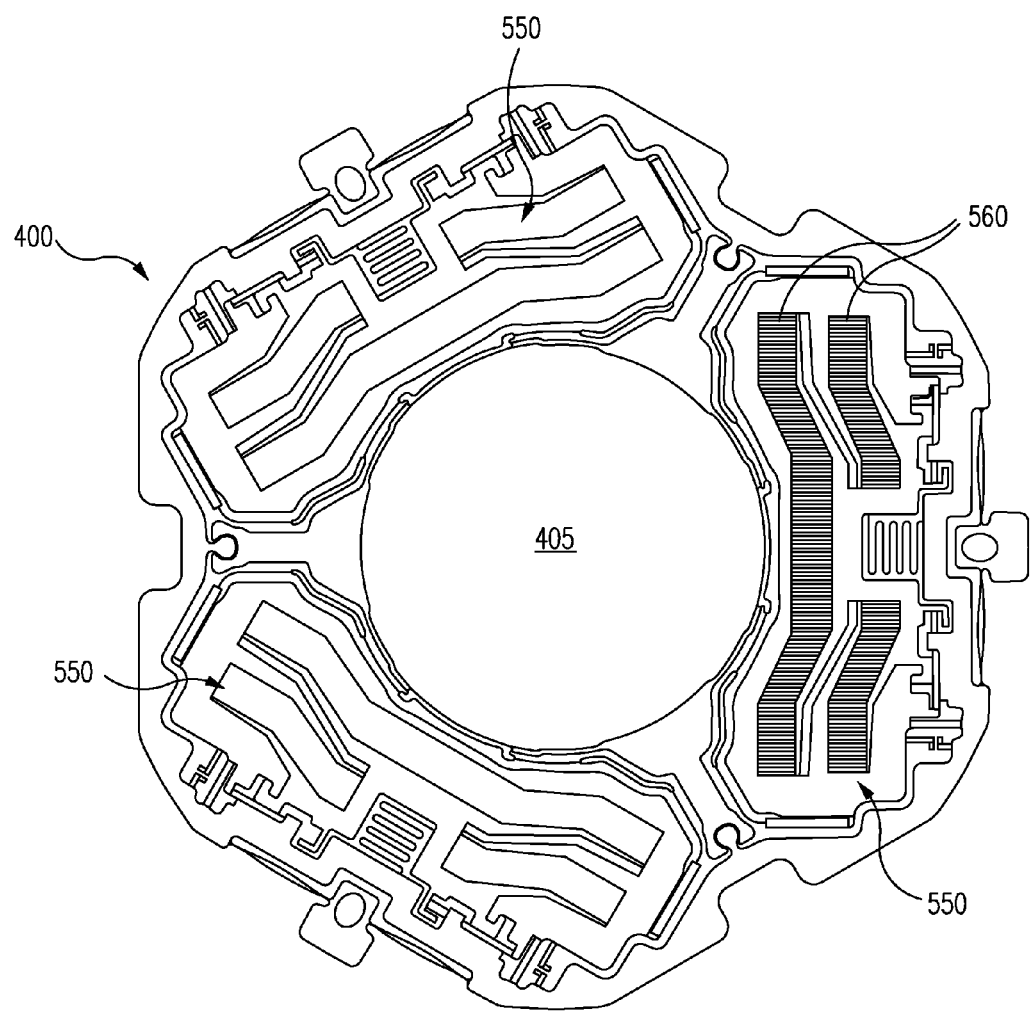
FIG. 5B illustrates a top view of the actuator device, in accordance with an embodiment.

FIG. 5B illustrates a top view of the actuator device 400 having teeth 560 shown in the actuator 550 in place of the blocks 552 representative thereof, in accordance with an embodiment. The teeth 560 shown may be considered to be reduced in number and exaggerated in size for clarity in FIG. 5B.

Figure 6A:
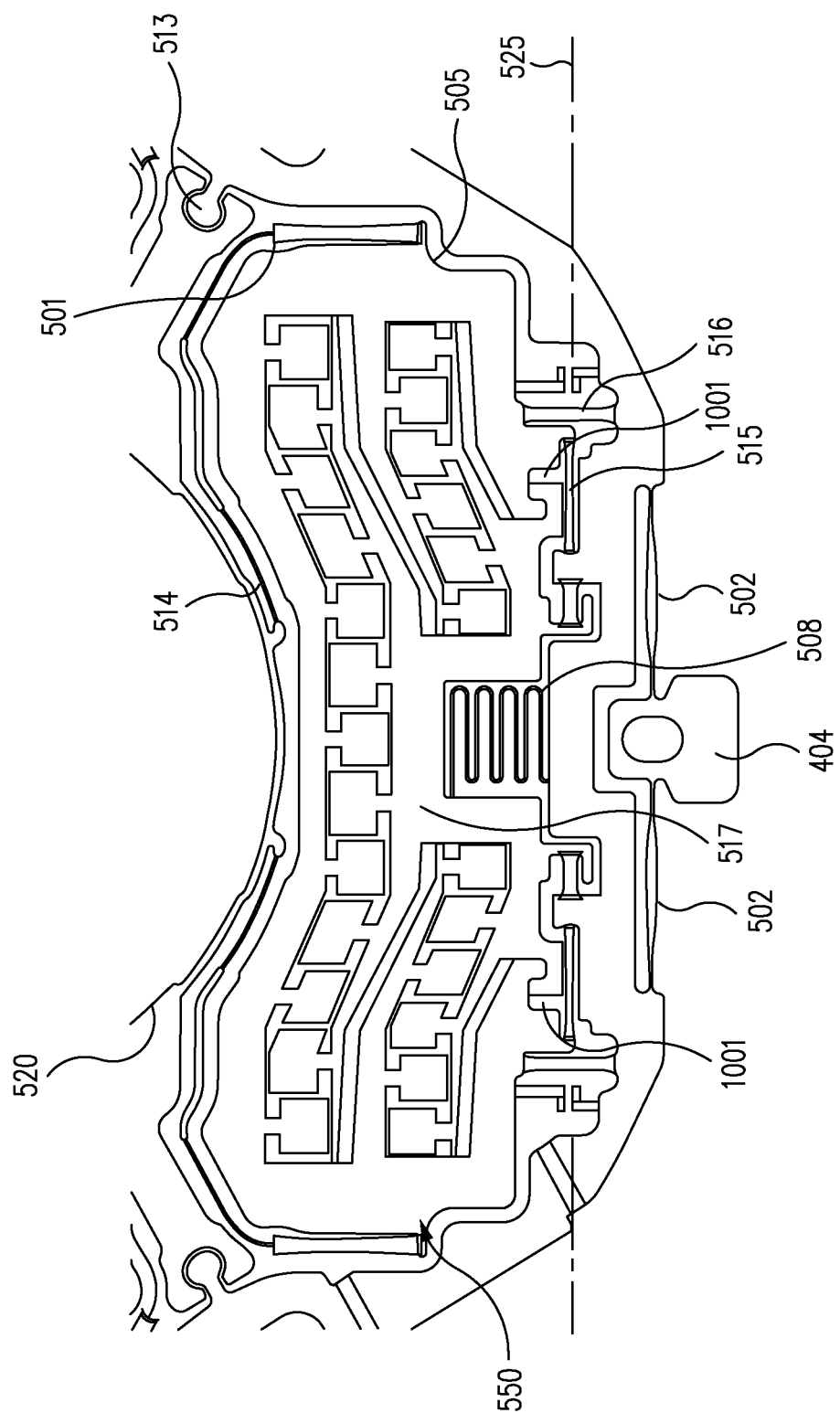
FIG. 6A illustrates a portion of the actuator device, in accordance with an embodiment.

FIG. 6A illustrates a top view of one of the actuators 550 having the inner hinge flexures 501, the ball-in-socket snubbers 513, the movable frame 505, the outer hinge flexures 516, the motion control torsional flexures 515, the cantilever flexures 514, the fixed frame 517, the pivot axis 525, the serpentine contact flexure 508, the pseudokinematic mount and electrical contact 404, and the platform 520, in accordance with an embodiment. FIG. 6A further illustrates a lateral snubber assembly 1001, which is further described herein.

The inner hinge flexure 501 cooperates with the cantilever flexure 514 to transfer desired motion from the movable frame 505 to the platform 520. Thus, actuation of the actuator 550 results in rotation of the movable frame 505, which in turn results in translation of the platform 520, as discussed herein.

The movable frame 505 may pivot on the outer hinge flexures 516 in a fashion similar to a door pivoting on its hinges. Upon the application of a shear force to the actuator device 400, one of the two outer hinge flexures 516 of the actuator 550 may be in tension while the outer hinge flexure 516 may be in compression. The two motion control torsional flexures 515 tend to mitigate undesirable buckling of the outer hinge flexure 516 in such instances.

Each actuator may be substantially disposed within a motion control mechanism that provides comparatively high lateral stiffness and comparatively soft rotational stiffness. In one embodiment, the motion control mechanism may have one or more (e.g., two) outer hinges flexures 516 and may have one or more (e.g., two) motion control torsional flexures 515. Thus, movement of the movable frame 505 may be substantially constrained to desirable rotation thereof.

In one embodiment, the motion control mechanism for one actuator 550 may comprise the outer frame 506, movable frame 505, the motion control torsional flexures 515, the outer hinge flexures 516, the inner hinge flexures 501, the cantilever flexure 514, and the platform 520. In one embodiment, the motion control mechanism may comprise all structures that tend to limit movement of the platform 520 to desired translational movement.

Each actuator 550 may be substantially contained within the motion control mechanism to substantially limit competition for real estate on the actuator device 400, in accordance with an embodiment. Since each actuator 550 and its associated motion control mechanism occupy substantially the same surface area of the actuator device 400, they do not compete for real estate. Thus, as the actuator 550 increases in size, its associated motion control mechanism may also increase in size. In certain embodiments, it is desirable to increase the size of an actuator 550 to increase the force provided thereby. In certain embodiments, it is desirable to also increase the size of the motion control mechanism to maintain its ability to desirably limit movement of the platform 520. The movable frame 550 may be considered as a portion of the motion control mechanism.

Figure 6B:
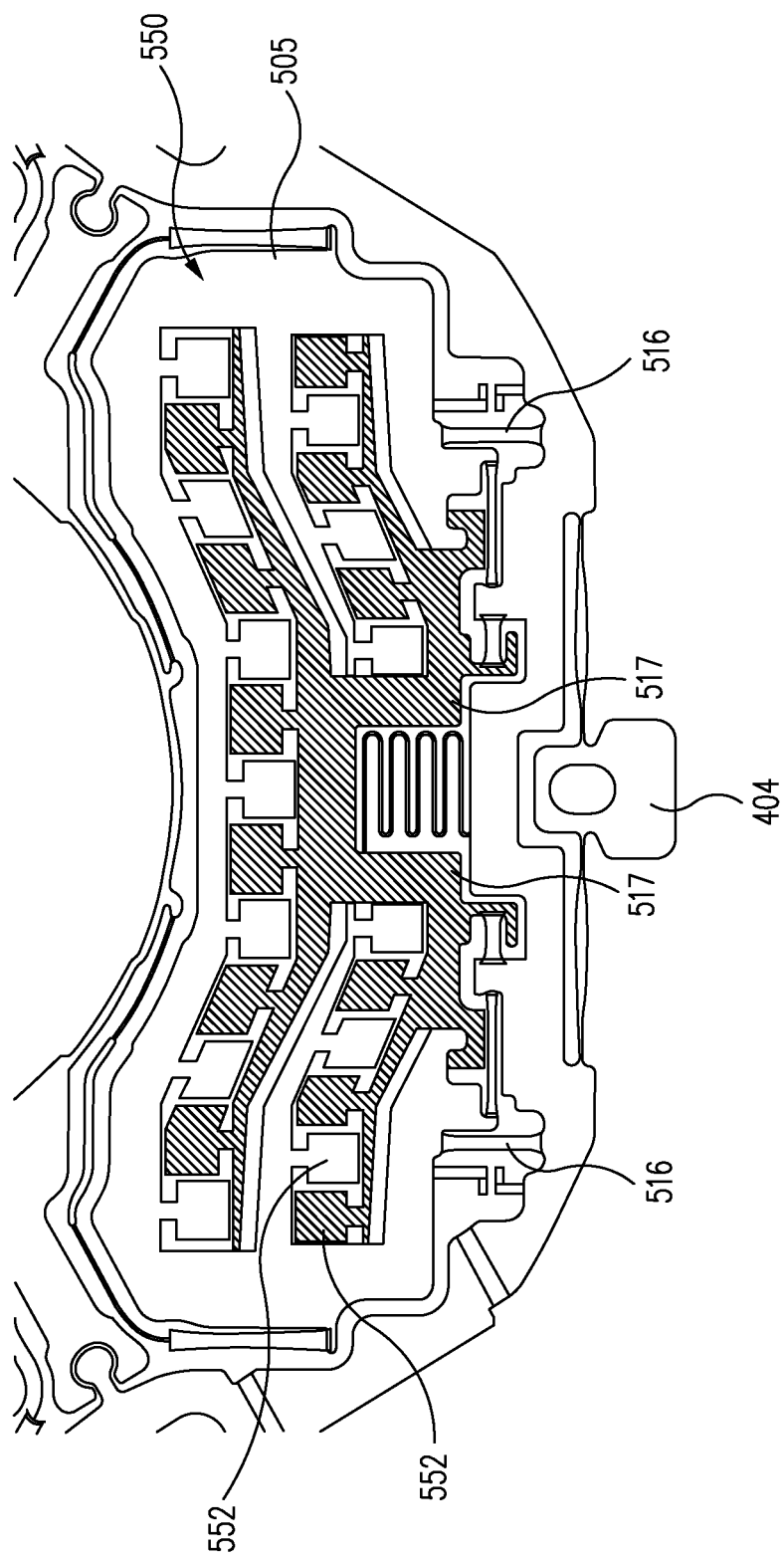
FIG. 6B illustrates a portion of the actuator device, in accordance with an embodiment.

FIG. 6B illustrates the actuator 550 showing the fixed frame 517 shaded for clarity, in accordance with an embodiment. The shaded fixed frame 517 may be deployed to a position out-of-plane of the actuator device 400 and may be fixed in this deployed position.

Figure 7:
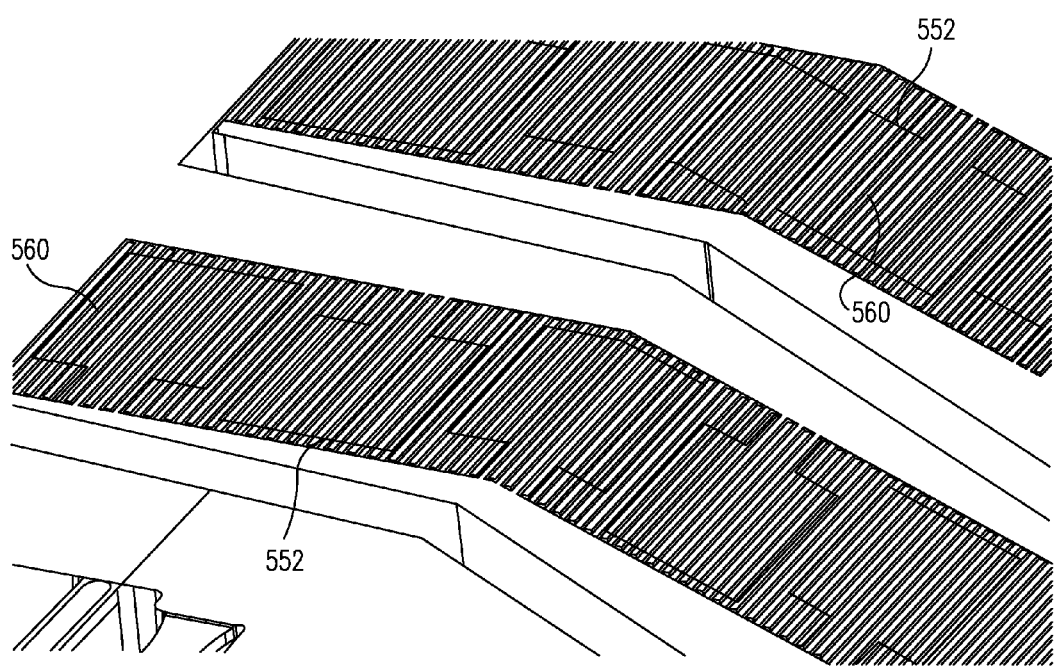
FIG. 7 illustrates portions of the actuator device, in accordance with an embodiment.

The movable frame 505 may support moving portions of the actuator 550, such as some of the teeth 560 (see FIG. 7). The fixed frame 517 may support fixed portions of the actuator 550, such as others of the teeth 560 (see FIG. 7). The application of a voltage to the actuator 550 may cause the movable frame 505 to rotate about the outer hinge flexures 516 toward the fixed frame 517. Removal or reduction of the voltage may permit a spring force applied by the inner hinge flexures 501, the outer hinge flexures 516 and the motion control torsional flexure 515 to rotate the movable frame 505 away from the fixed frame 517. Sufficient clearance between the movable frame 505 and the fixed frame 517 may be provided to accommodate such desired movement.

Figure 6C:
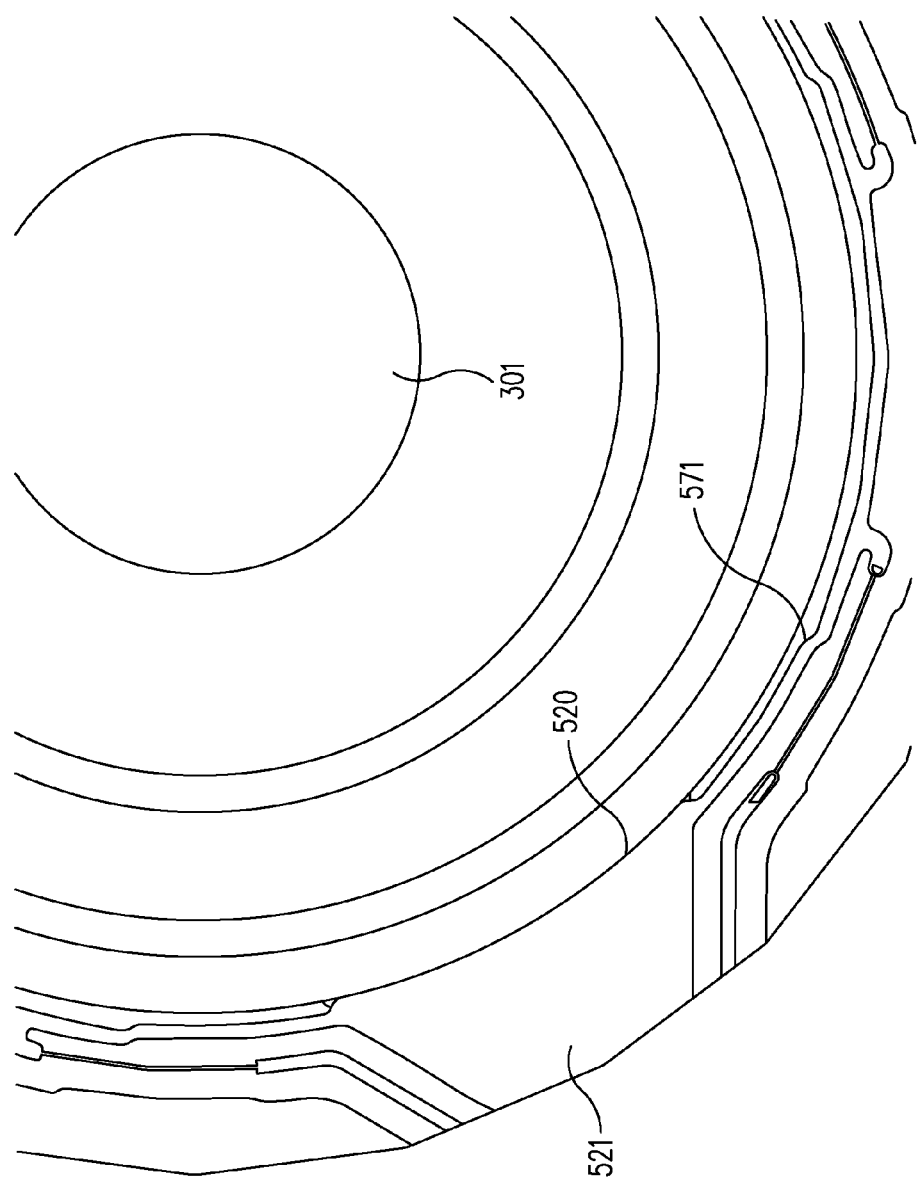
FIG. 6C illustrates a portion of a platform, in accordance with an embodiment.

FIG. 6C illustrates a portion of the platform 520 having radial variations 571, in accordance with an embodiment. In one embodiment, the radial variations 571 may be formed in the platform 520 to permit the platform 520 to expand. The radial variations 571 may be angular bends in the platform 520. Thus, an optical element such as the movable lens 301 may be inserted into the opening 405 of the platform 520, which may expand to receive the movable lens 301 and which may grip the movable lens 301. The opening 405 may expand as the radial variations 571 of the platform 520 deform (e.g., tend to straighten), so as to increase the circumference of the opening 405.

Figure 6D:
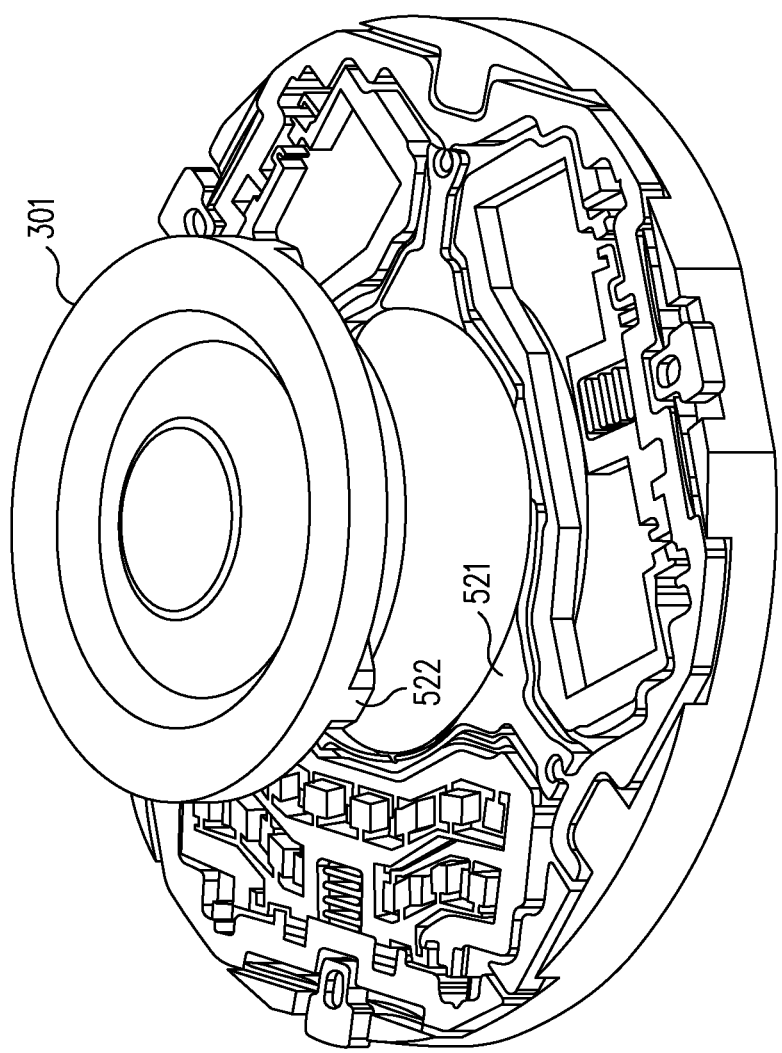
FIG. 6D illustrates a bottom view of a movable lens positioned for mounting to the actuator device, in accordance with an embodiment.
Figure 6E:
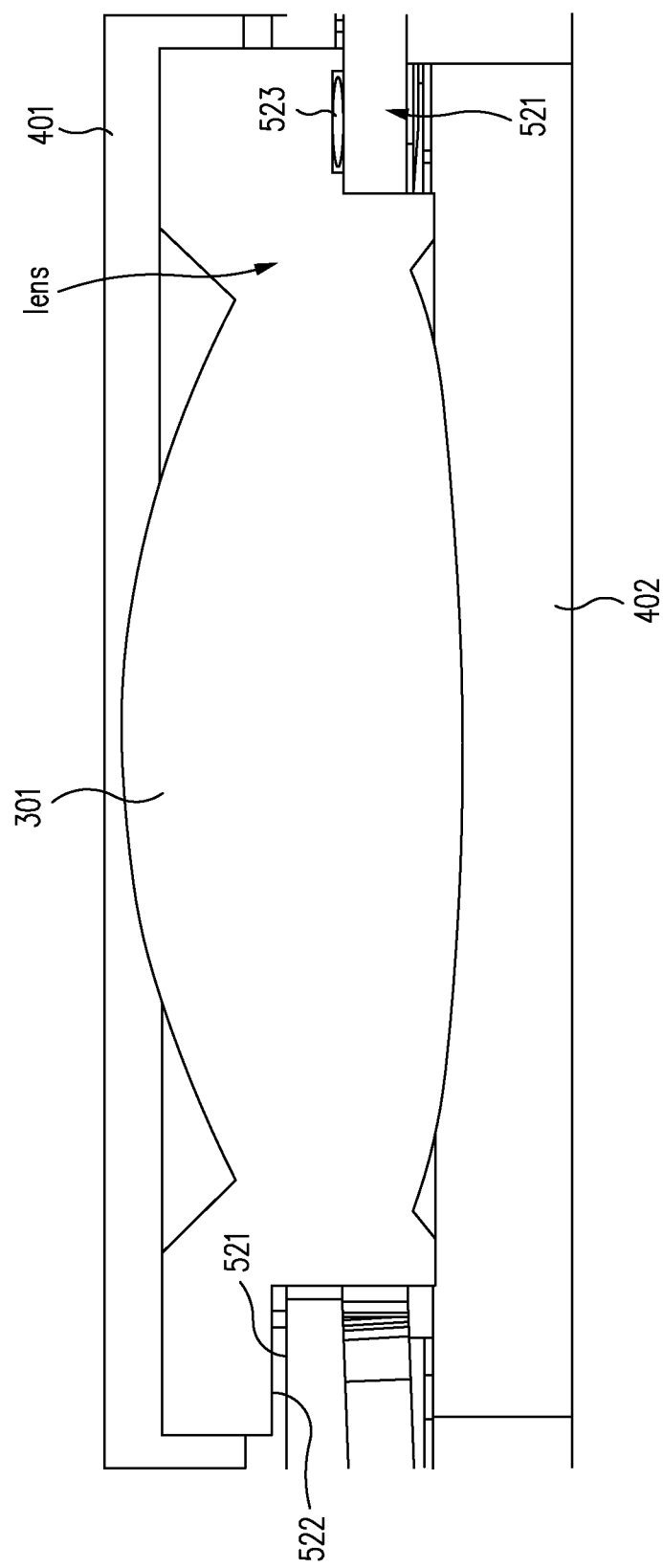
FIG. 6E illustrates a side view of the movable lens mounted to the actuator device, in accordance with an embodiment.

FIG. 6D illustrates a perspective view of a movable lens positioned for mounting to the actuator device 400 and FIG. 6E illustrates a side view of the movable lens 301 attached to the actuator device 400, in accordance with an embodiment. In one embodiment, the movable lens 301 may be adhesively bonded to the platform 550, such as by adhesively bonding standoffs 522 of the movable lens 301 to the lens pads 521. For example, epoxy 523 may be used to adhesively bond the movable lens 301 to the platform 520. The movable lens 301 may be supported by the lens pad 521.

FIG. 7 illustrates a portion of the actuator 550 showing blocks 552 superimposed over the teeth 560 of an actuator 550, in accordance with an embodiment. As discussed herein, the blocks 552 are representative of the teeth 560.

Figure 8:
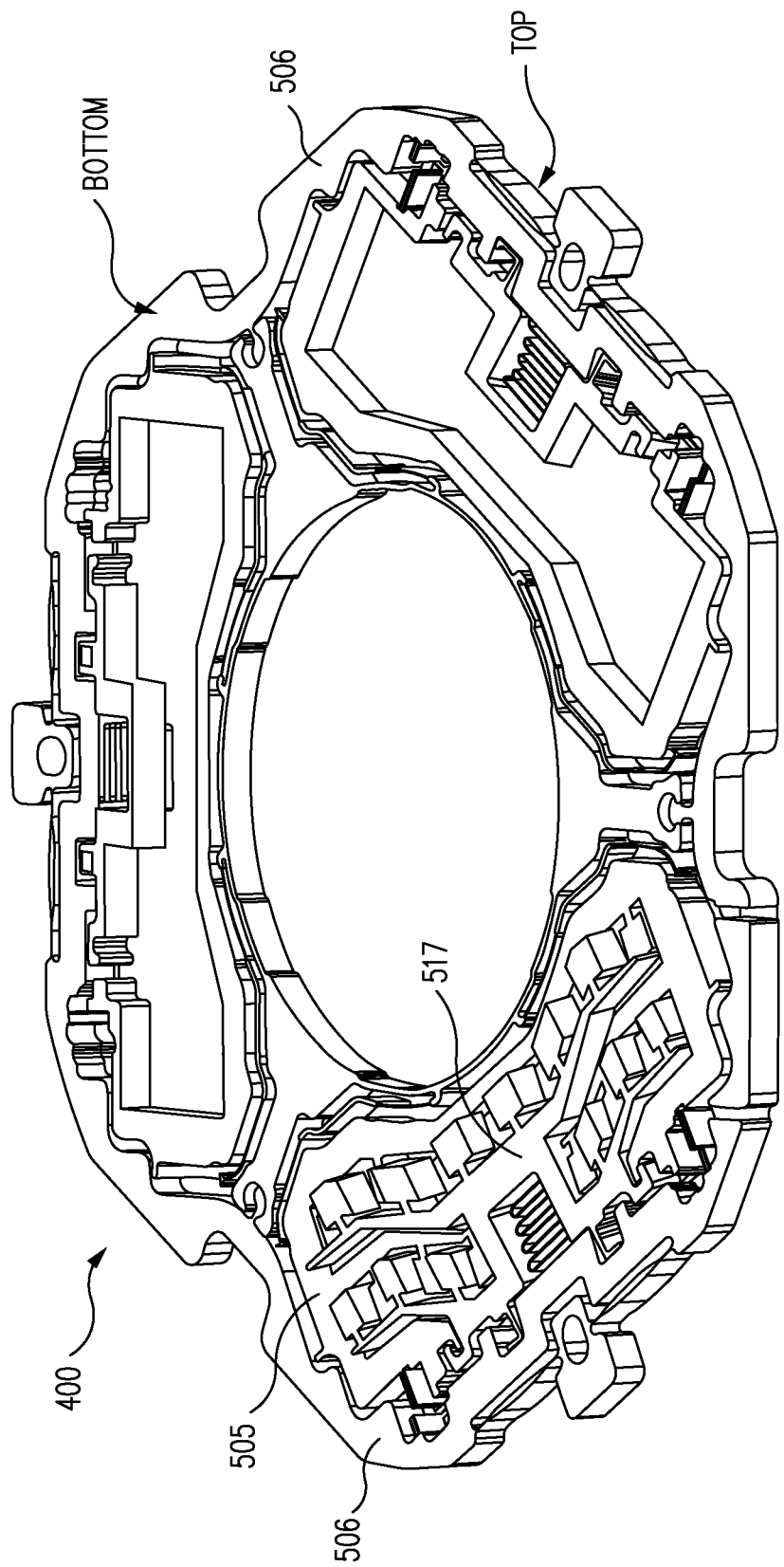
FIG. 8 illustrates a bottom view of the actuator device in a deployed configuration, in accordance with an embodiment.

FIG. 8 illustrates a bottom perspective view of the actuator device 400 in a deployed configuration, in accordance with an embodiment. In the deployed configuration the unactuated movable frame 505 is substantially in-plane with respect to the outer frame 506 and the deployed fixed frame 517 is substantially out-of-plane with respect to the outer frame 506 and the movable frame 505.

A voltage may be applied to each actuator 550 via the electrical contacts 404. For example, two of the three contacts 404 may be used to apply a voltage from the lens barrel 200 to the actuator device 400. The third contact 404 may be unused or may be used to redundantly apply one polarity of the voltage from the lens barrel 200 to the actuator device 400.

Substantially the same voltage may be applied to the three actuators 550 to result in substantially the same movement of the moving frames 505 thereof. Application of substantially the same voltage to the three actuators 550 may result in translation of the platform 520 with respect to the outer frame 506 such that the platform 520 remains substantially parallel to the outer frame 506. Thus, an optical element such as the movable lens 301 may be maintained in a desired alignment as the optical element is moved, such as along an optical axis 410 (FIG. 3B) thereof.

Substantially different voltages may be applied to the three actuators 550 to result in substantially different movements of the moving frames 505 thereof. Substantially different voltages may be applied to the three actuators 550 using the three contacts 404 and a common return. Thus, each contact 404 may apply a separately controlled voltage to a dedicated one of the three actuators 550.

The application of substantially different voltages to the three actuators 550 may result in translation of the platform 520 with respect to the outer frame 506 such that the platform tilts substantially with respect to the outer frame 506. Thus, when substantially different voltages are applied, the platform 520 does not necessarily remain substantially parallel to the outer frame. The application of different voltages to the three actuators 550 may be used to align the platform 520 to the outer frame 506, for example. The application of different voltages to the three actuators 550 may be used to facilitate optical image stabilization or lens alignment, for example.

Figure 9A:
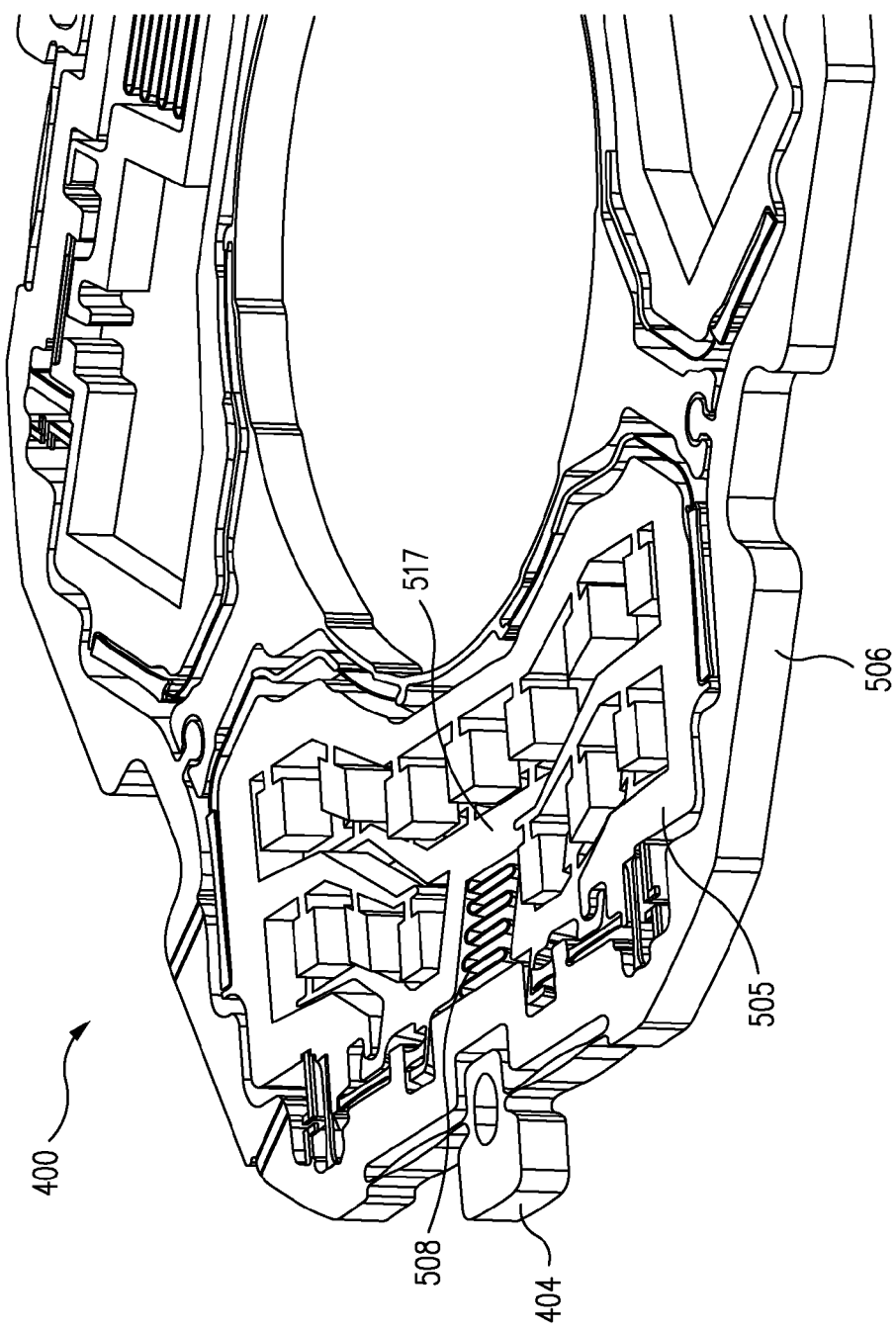
FIG. 9A illustrates a portion of the actuator device in a deployed configuration without any voltage applied thereto, in accordance with an embodiment.

FIG. 9A illustrates a portion of the actuator device 400 in a deployed configuration without any voltage applied thereto, in accordance with an embodiment. Without any voltage applied to the actuator device 400, the movable frame 505 is substantially in-plane with respect to the outer frame 506 and the deployed fixed frame 517 is substantially out-of-plane with respect to the outer frame 506 and the movable frame 505.

Figure 9B:
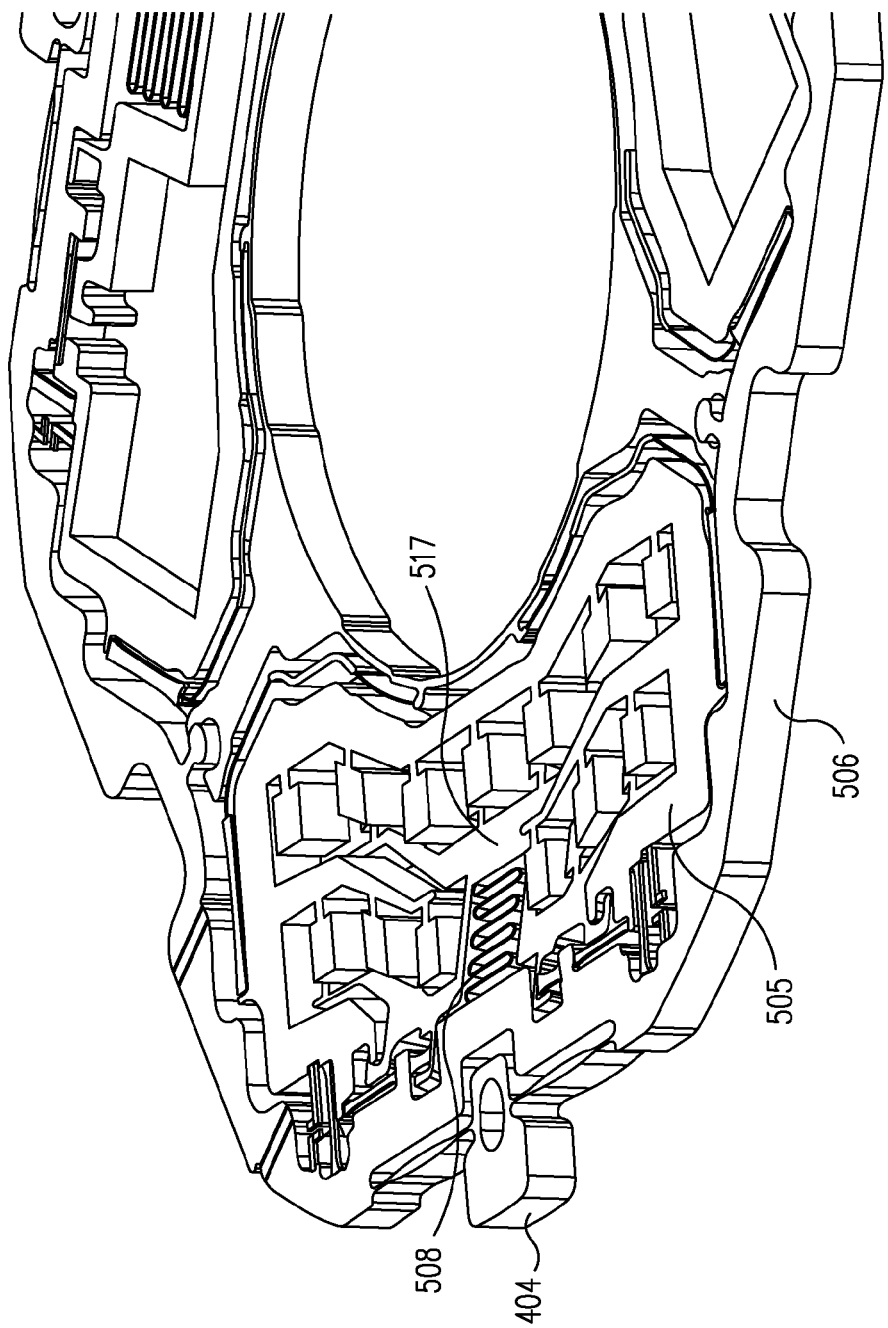
FIG. 9B illustrates a portion of the actuator device in a deployed configuration with a small voltage applied thereto, in accordance with an embodiment.

FIG. 9B illustrates a portion of the actuator device 400 in a deployed configuration with a small voltage applied thereto, in accordance with an embodiment. With the small voltage applied, the movable frame 505 has rotated toward the deployed fixed frame 517 and is in a partially actuated position.

FIG. 9C illustrates a portion of the actuator device 400 in a deployed configuration with a maximum voltage applied thereto, in accordance with an embodiment. As may be seen, the movable frame 505 has rotated further toward the deployed fixed frame 517 and is in a fully actuated position.

Figure 10:
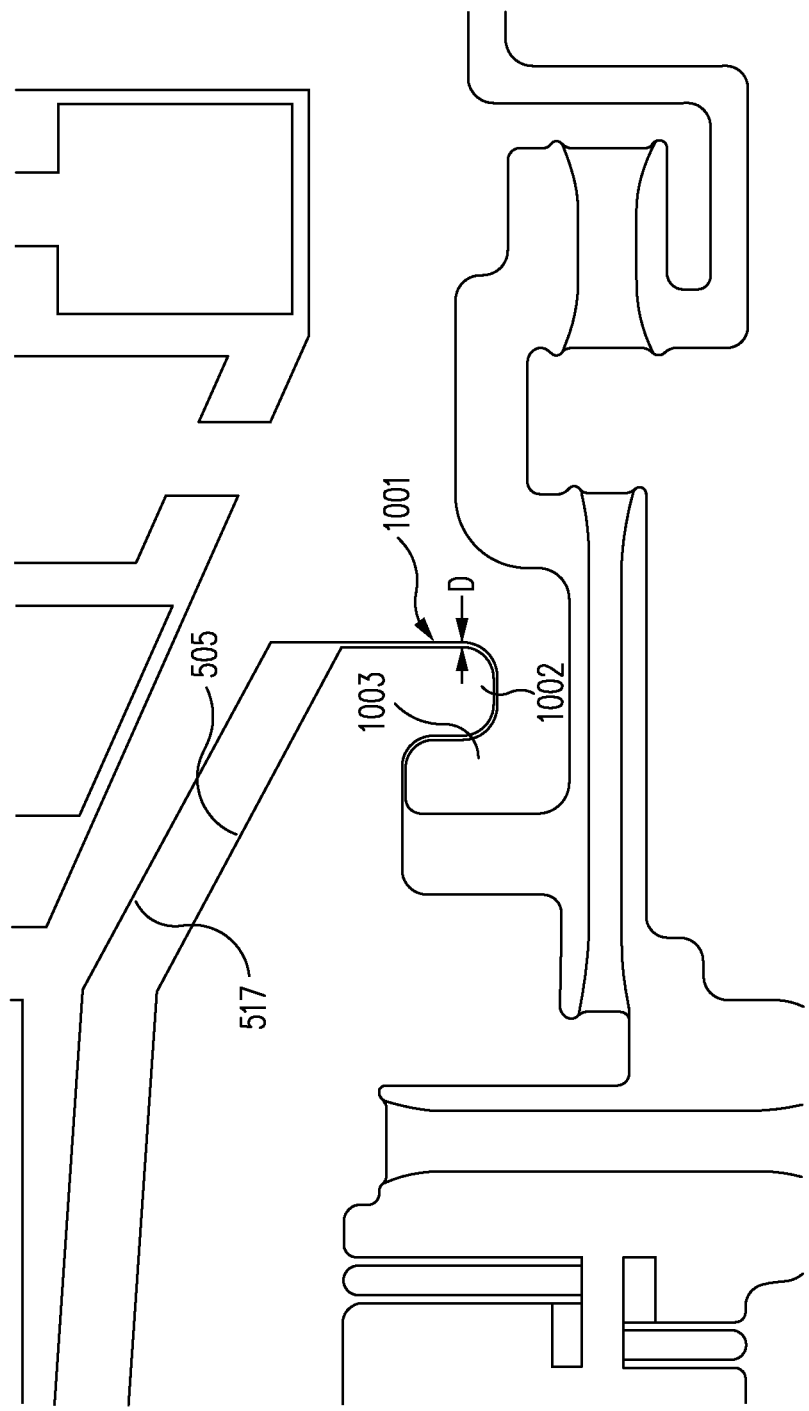
FIG. 10 illustrates a lateral snubber assembly, in accordance with an embodiment.

FIG. 10 illustrates a top view of a lateral snubber assembly 1001, in accordance with an embodiment. The lateral snubber assembly 1001 may have a first snubber member 1002 and a second snubber member 1003. The first snubber member 1002 may be formed upon the fixed frame 517 and the second snubber member may be formed upon the movable frame 505. The first snubber member 1002 and the second snubber member 1003 may cooperate to inhibit undesirable lateral motion of the movable frame 505 with respect to the fixed frame 517 (and consequently with respect to the outer frame 506, as well) during shock or large accelerations. A gap "D" between the first snubber member 1002 and the second snubber member 1003 may approximately 2-3 micrometers wide to limit such undesirable lateral motion.

Figure 11:
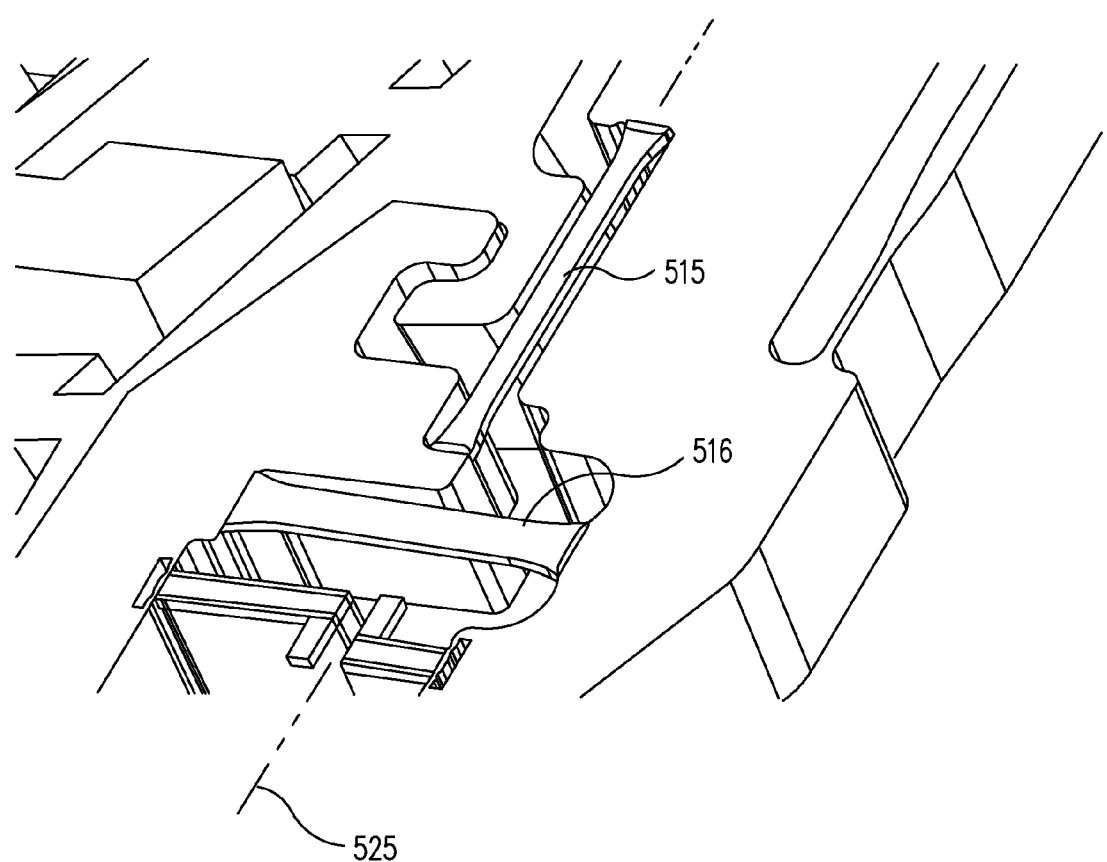
FIG. 11 illustrates a hinge flexure and a motion control torsional flexure, in accordance with an embodiment.

FIG. 11 illustrates a perspective view of the motion control torsional flexure 515 and the outer hinge flexure 516, in accordance with an embodiment. The motion control torsional flexure 515 and the outer hinge flexure 516 may be thinner than other portions of the actuator device 400 to provide the desired stiffness of the motion control torsional flexure 515 and the outer hinge flexure 516. For example, in one embodiment the outer hinge flexures 516, the inner hinge flexures 501, and the motion control torsional flexures 515 may have a width of approximately 100 microns and a thickness of approximately 2-3 microns.

The motion control torsional flexure 515 may be located on the pivot axis 525. In one embodiment, the pivot axis 525 is a line that connects the centers of the two outer hinge flexures 516. In one embodiment, the pivot axis 525 is the hinge line or axis about which the movable frame 506 rotates.

Figure 12:
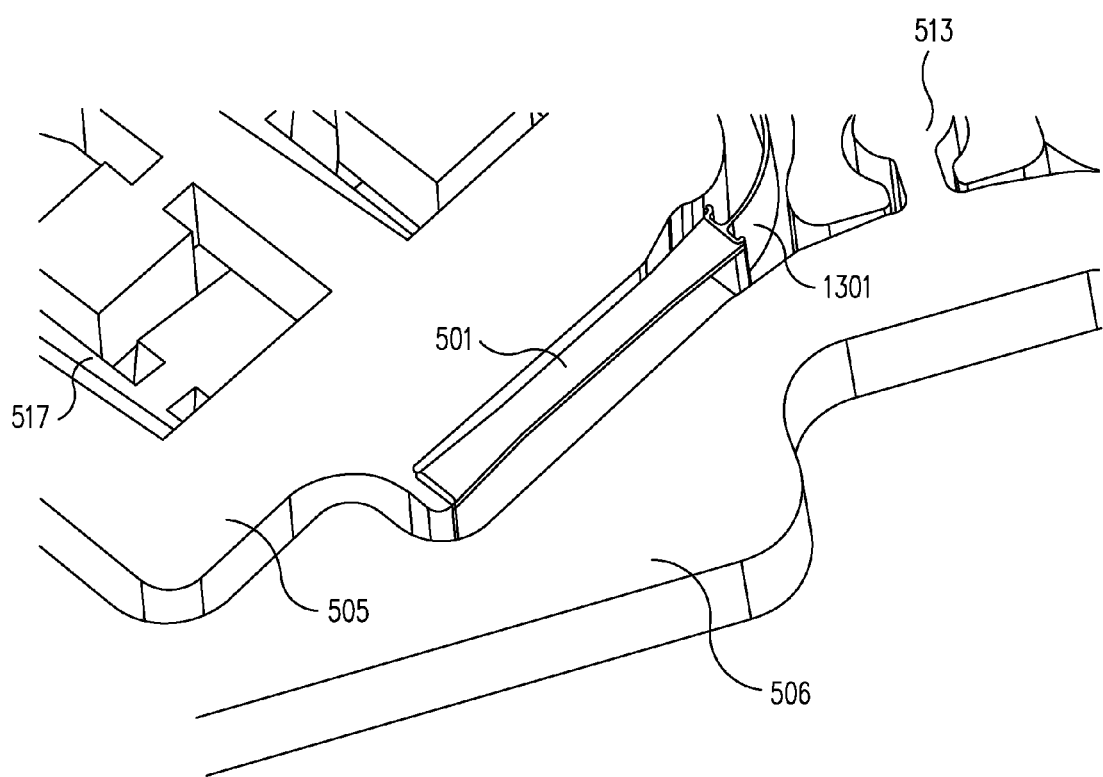
FIG. 12 illustrates an inner motion control hinge, in accordance with an embodiment.

FIG. 12 illustrates a perspective view of an inner hinge flexure 501, in accordance with an embodiment. The inner hinge flexure 501 may be thinner than other portions of the actuator device 400 to provide the desired stiffness of the inner hinge flexure 501. For example, in one embodiment, the inner hinge flexure 501 may be approximately 500 micrometers long, 60 micrometers wide, and 2-3 micrometers thick.

Figure 13:
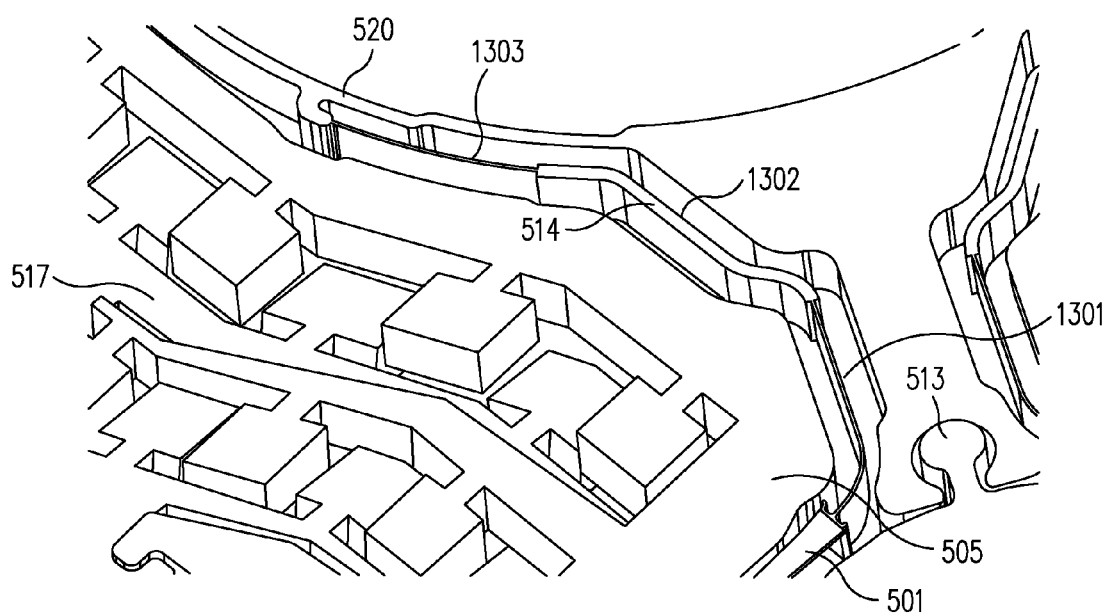
FIG. 13 illustrates a cantilever flexure, in accordance with an embodiment.

FIG. 13 illustrates a perspective view of a cantilever flexure 514 having the inner hinge flexure 501, a first thinned section 1301, a thicker section 1302, and a second thinned section 1303, in accordance with an embodiment. The cantilever flexure 514 may be used to transfer movement of the movable frames 505 to the platform 520. The cantilever flexure 514 may be used to facilitate the conversion of rotation of the movable frames 505 into translation of the platform 520.

The inner hinge flexure 501 may bend to permit the movable frame 505 to rotate while the platform 520 translates. The first thinned section 1301 and the second thinned section 1303 may bend to permit a change in distance between the movable frame 505 and the platform 520 as the movable frame 505 transfers movement to the platform 520.

The cantilever flexure 514 may be thinner proximate the ends thereof and may be thicker proximate the center thereof. Such configuration may determine a desired ratio of stiffnesses for the cantilever flexure 514. For example, it may be desirable to have a comparatively low stiffness radially to compensate for the change in distance between the movable frames 505 and the platform 520 as the movable frame 505 transfers movement to the platform 520.

Figure 14:
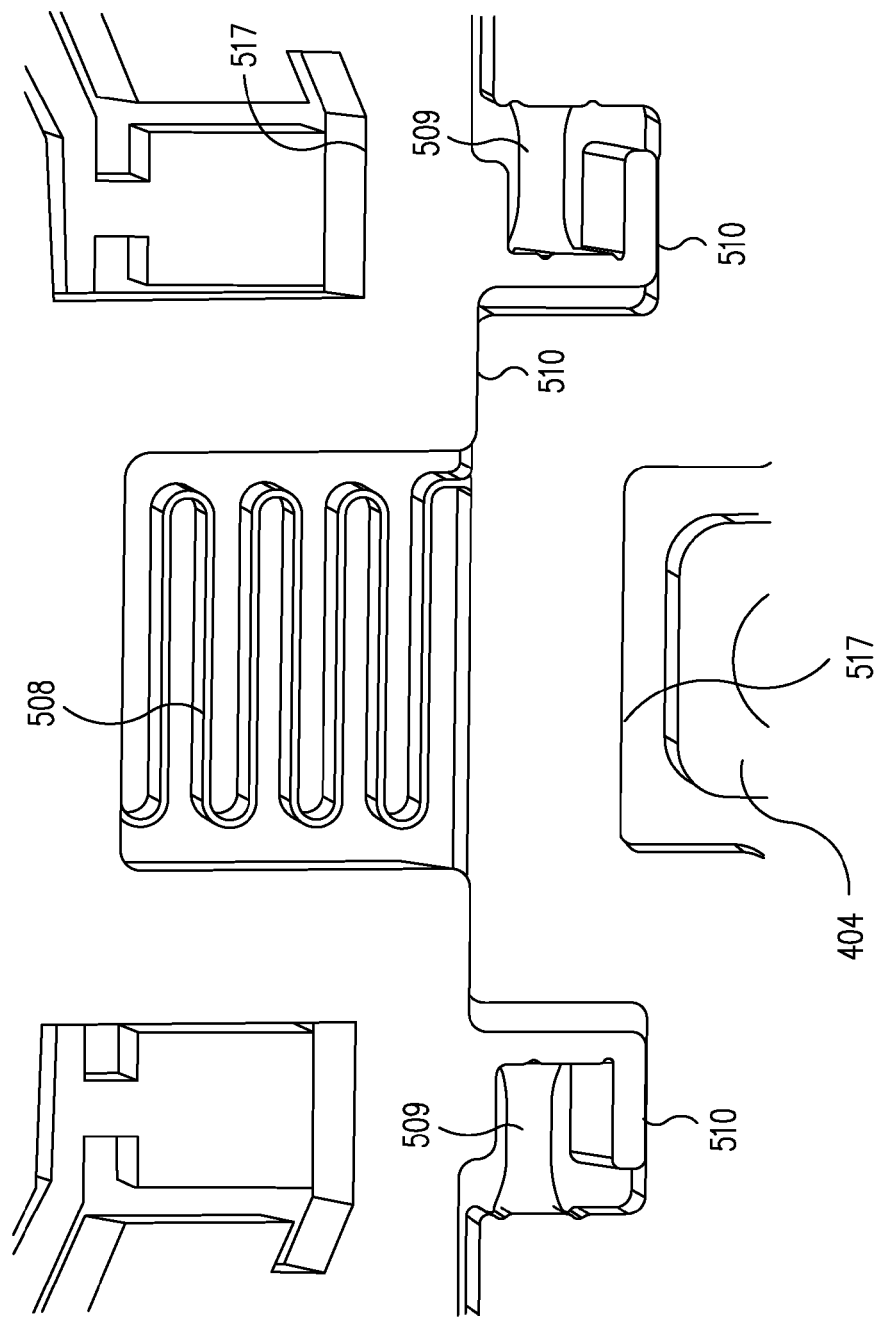
FIG. 14 illustrates a serpentine contact flexure and a deployment torsional flexure, in accordance with an embodiment.

FIG. 14 illustrates a perspective view of the serpentine contact flexure 508 and the deployment torsional flexure 509, in accordance with an embodiment. The serpentine contact flexure 508 may facilitate electrical contact between the electrical contacts 404 and the deployed fixed frame. The deployment torsional flexures 509 may facilitate rotation of the deployed fixed frame 517 with respect to the outer frame 506 during deployment.

Figure 15:
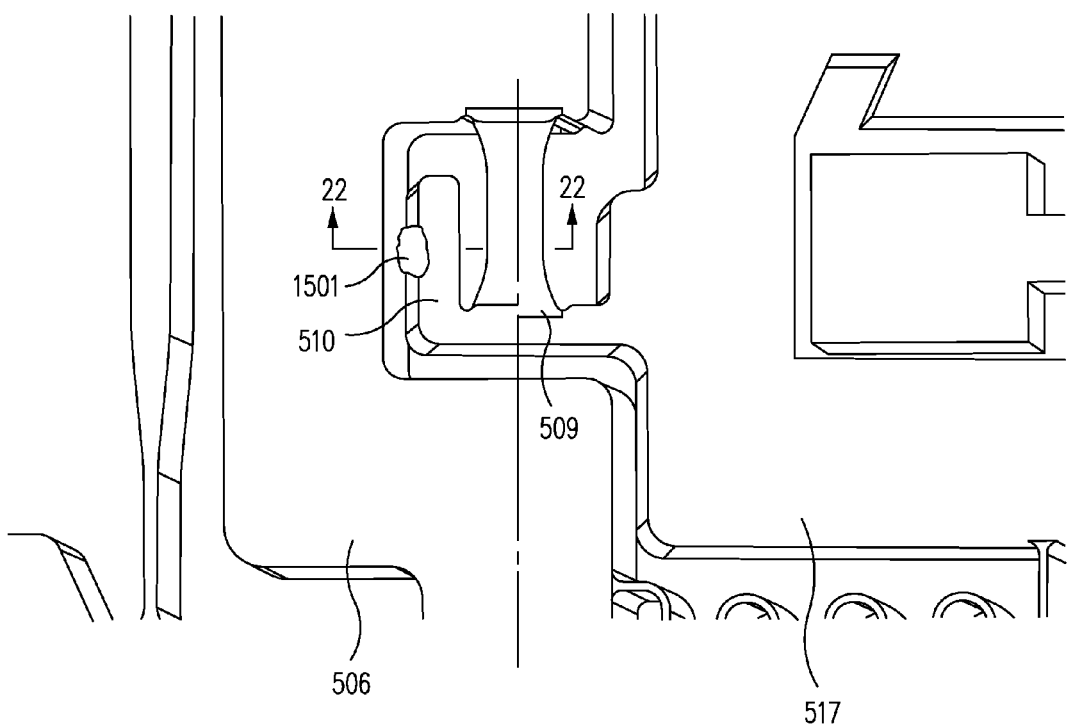
FIG. 15 illustrates a top view of a deployment stop, in accordance with an embodiment.

FIG. 15 illustrates a perspective top view of a deployment stop 510 showing that it does not contact an outer frame 506 on the top side when deployed, in accordance with an embodiment. An epoxy 1501 may be applied to the top surfaces of the deployment stop 510 and the outer frame 506 to fix the deployment stop 510 into position with respect to the outer frame 506. Thus, the epoxy 1501 may fix the deployed fixed frame 517 into position with respect to the outer frame 506. Various portions of the deployed fixed frame 517 may function as the deployment stops 517. For example, other portions of the deployed fixed frame 517 that abut the outer frame 506 when the deployed fixed frame is deployed may function as the deployment stops 510.

Figure 16:
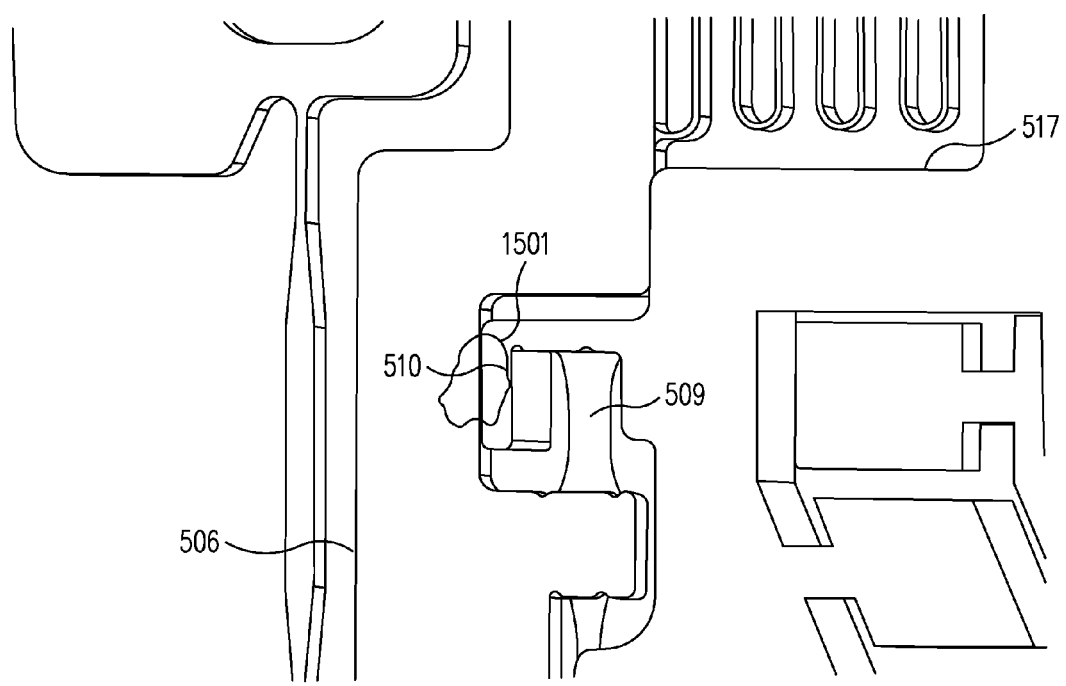
FIG. 16 illustrates a bottom view of the deployment stop, in accordance with an embodiment.

FIG. 16 illustrates a perspective bottom view of the deployment stop 510 showing that it contacts the outer frame 506 on the bottom side when deployed, in accordance with an embodiment. The epoxy 1501 may be applied to the bottom surfaces of the deployment stop 510 and the outer frame 506 to fix the deployment stop 510 into position with respect to the outer frame 506. The epoxy 1501 may be applied to both the top surfaces and the bottom surfaces of the deployment stop 510 and the outer frame 506, if desired.

Figure 17A:
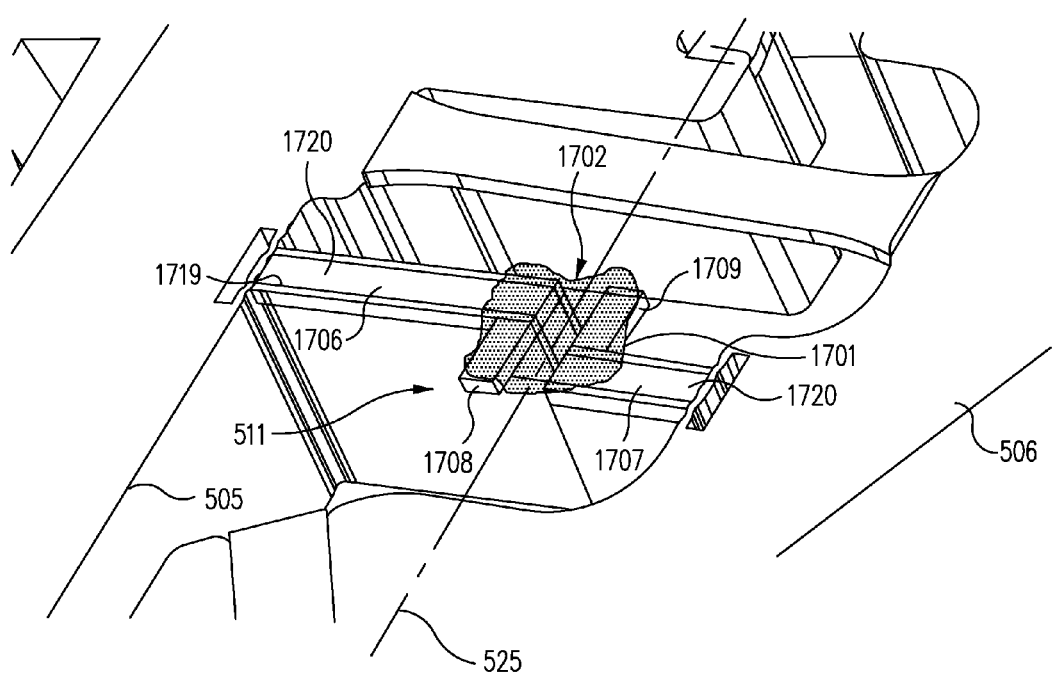
FIG. 17A illustrates a flap damper, in accordance with an embodiment.

FIG. 17A illustrates a perspective view of a flap damper 511, in accordance with an embodiment. The flap damper 511 is located where the desirable relative motion during intended operation, (e.g., actuation) of actuators 550, is comparatively low and where the potential undesirable relative motion during shock is comparatively high. For example, the flap damper 511 may be formed on the pivot axis 525.

A damping material 1701 may extend across a gap 1702 formed between the outer frame 506 and the movable frame 505. The damping material 1701 may have a high damping coefficient. For example, in one embodiment, the damping material 1701 may have a damping coefficient of between 0.7 and 0.9. For example, the damping material 1701 may have a damping coefficient of approximately 0.8. In one embodiment, the damping material 1701 may be an epoxy.

The damping material 1701 may readily permit the desired motion of the movable frame 505 relative to the outer frame 506. The damping material 1701 may inhibit undesired motion of the movable frame 505 relative to the outer frame 506 due to a shock. Thus, the damping material 1701 may permit rotation of the movable frame 505 relative to the outer frame 506 during actuation of the actuators 550 and may inhibit lateral motion and/or out of plane motion of the movable frame 505 relative to the outer frame 506 during a shock.

The flap damper 511 may have a flap 1706 that extends from the movable frame 505 and may have a flap 1707 that extends from the outer frame 506. A gap 1702 may be formed between the flap 1706 and the flap 1707.

An extension 1708 may extend from the flap 1706 and/or an extension 1709 may extend from the flap 1707. The extension 1708 and the extension 1709 may extend the length of the gap 1702 such that more damping material 1701 may be used than would be possible without the extension 1708 and/or the extension 1709.

Trenches 1719 may be formed in flaps 1706 and/or 1707 and a trench material 1720 that is different from the material of the flaps 1706 and 1707 may be deposited within the trenches 1719. For example, the flaps 1706 and 1707 may be formed of single crystalline silicon and the trench material 1720 may be formed of polycrystalline silicon. Any desired combination of materials may be used for the flaps 1706 and 1707 and for the trench material 1720, so as to achieve the desired stiffness of the flaps 1706 and 1707.

Figure 17B:
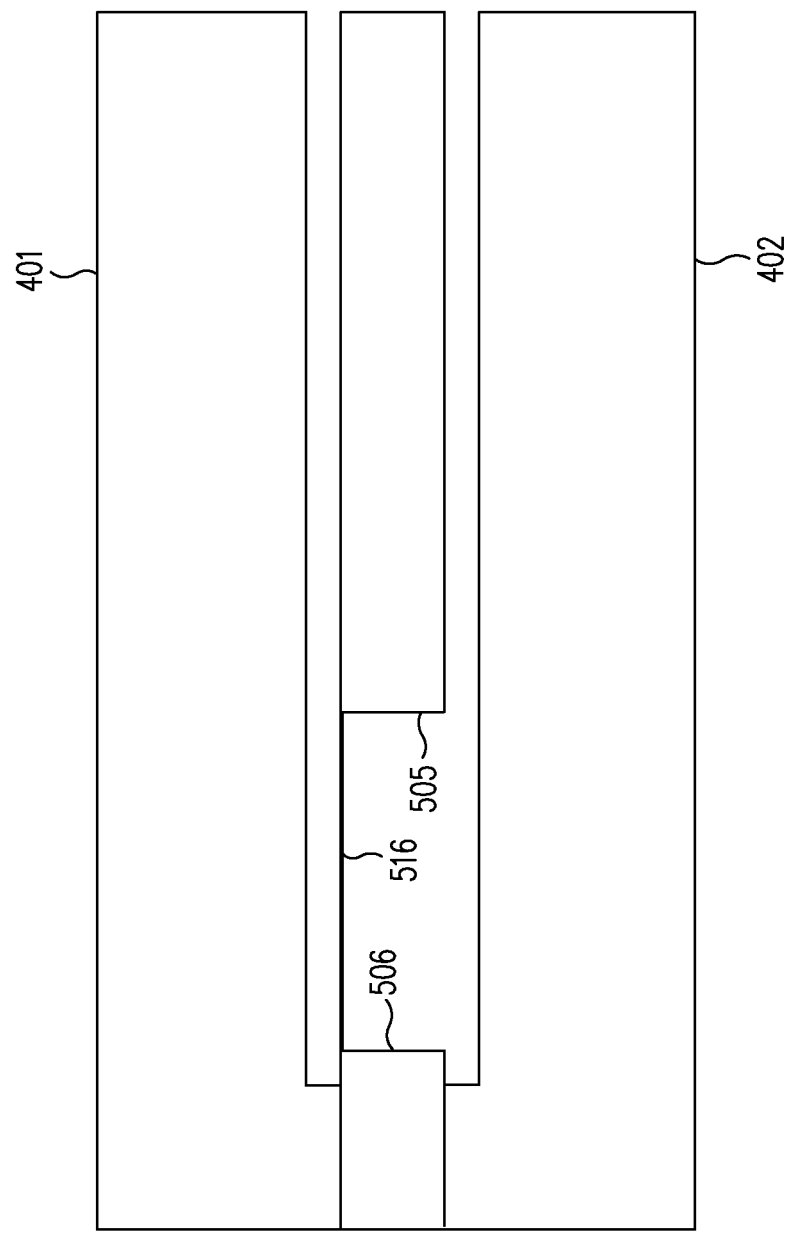
FIG. 17B illustrates a movable frame disposed between an upper module cover and a lower module cover with no shock applied, in accordance with an embodiment.

FIG. 17B illustrates the movable frame 505 disposed between the upper module cover 401 and the lower module cover 402 without a shock being applied thereto. In the absence of a shock, the movable frame 505 remains in its unactuated position and the outer hinge flexure 516 is unbent.

Figure 17C:
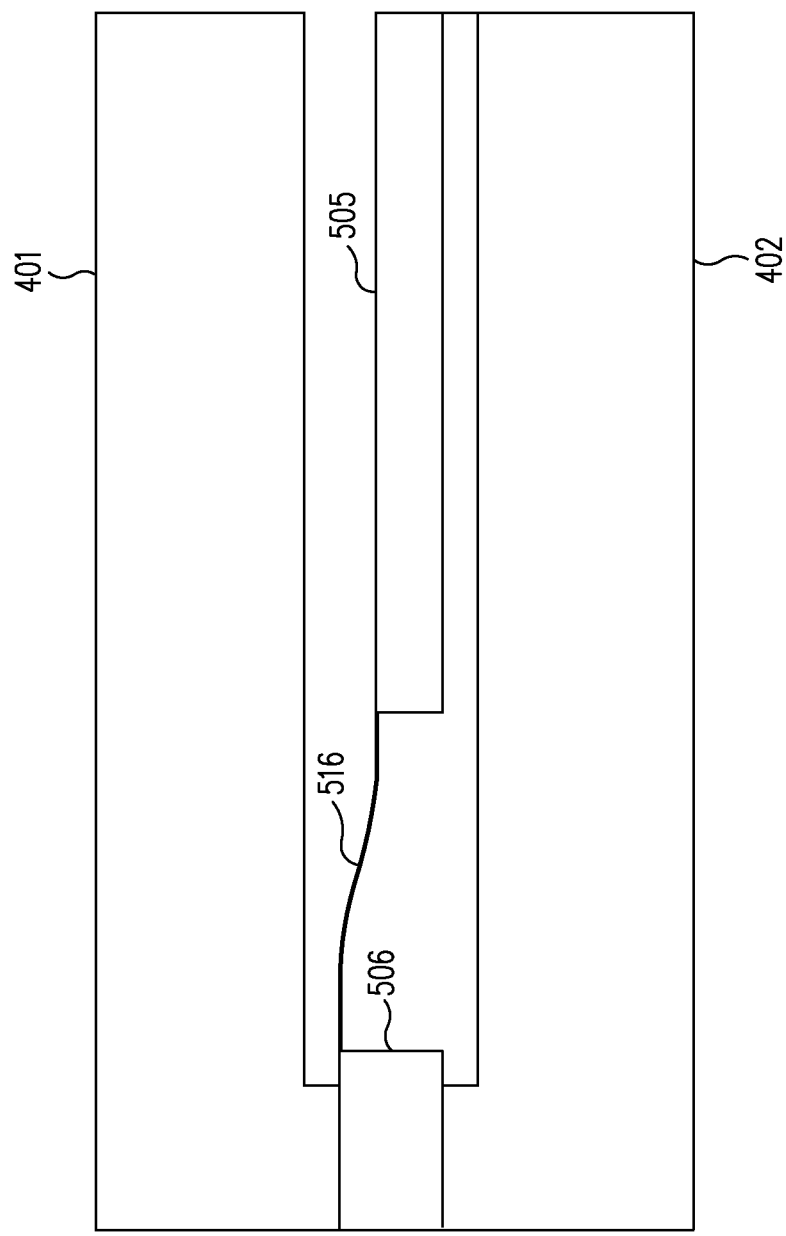
FIG. 17C illustrates the movable frame disposed between the upper module cover and the lower module cover with a shock applied, in accordance with an embodiment.

FIG. 17C illustrates the movable frame 505 after it has been moved to a position against the lower module cover 402 by a shock, such as may be caused by dropping the electronic device 100. Movement of the movable frame 505 may be limited or snubbed by the lower module housing 402 and undesirable double bending of the outer hinge flexure 516 may be limited thereby. In a similar fashion, the upper module housing 401 may limit movement of the movable frame 505 and double bending of the outer hinge flexure 516. Thus, undesirable stress within the outer hinge flexures 516 may be mitigated.

FIGS. 17D-17H illustrate an alternative embodiment of an outer hinge flexure 1752. As illustrated in these figures, in some embodiments, the outer hinge flexures 1752 may be X-shaped for increased control of the motion of the moveable frame 505 in the lateral direction. The outer hinge flexures 516, 1752 may generally tend to bend, such as about a central portion thereof, to facilitate movement of the moveable frame 505 with respect to the outer frame 506. Other shapes are contemplated. For example, the outer hinge flexure 1752 can be shaped like a H, I, M, N, V, W, Y, or may have any other desired shape. Each outer hinge flexure 1752 can comprise any desired number of structures that interconnect the outer frame 506 and the movable frame 505. The structures may be interconnected or may not be interconnected. The structures may be substantially identical with respect to one another or may be substantially different with respect to one another. Each outer hinge flexure 1752 may be substantially identical with respect to each other hinge flexure 1752 or may be substantially different with respect thereto.

The outer hinge flexures 516, 1752 and any other structures may be formed by etching as discussed herein. The outer hinge flexure and any outer structures may comprise single crystalline silicon, polycrystalline silicon, or any combination thereof.

FIGS. 17D-F and 17I-17N show an alternative embodiment of the lateral snubber assembly 1754, another embodiment of which is disused with respect to FIG. 10 herein. The lateral snubber assembly 1754 of FIGS. 17D-F and 17I-17N generally has more rounded curves with respect to the lateral snubber assembly 1001 of FIG. 10.

Figure 17D:
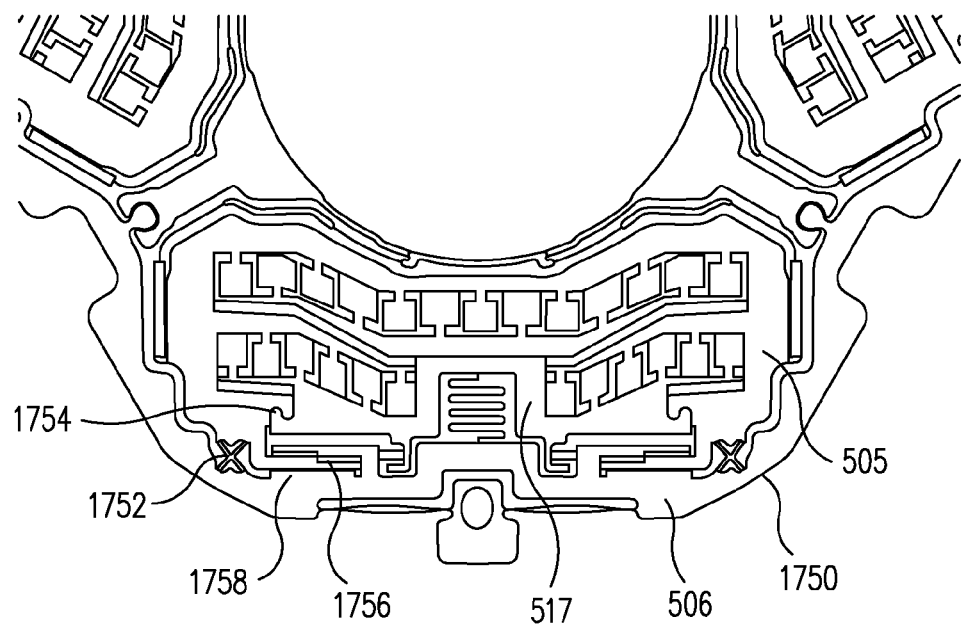
FIG. 17D illustrates a partial top view of another actuator device, in accordance with an embodiment.
Figure 17E:
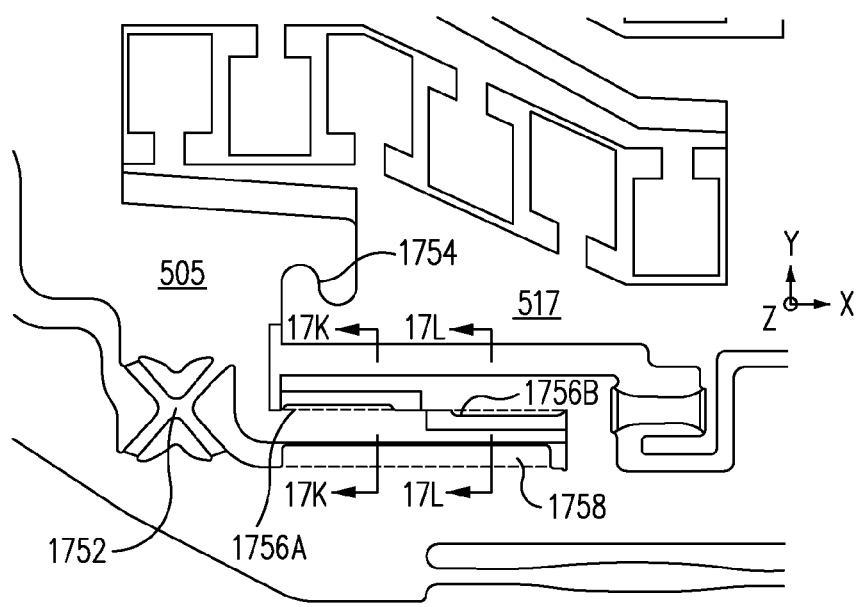
FIG. 17E illustrates an enlarged top view of the actuator device, in accordance with an embodiment.
Figure 17F:
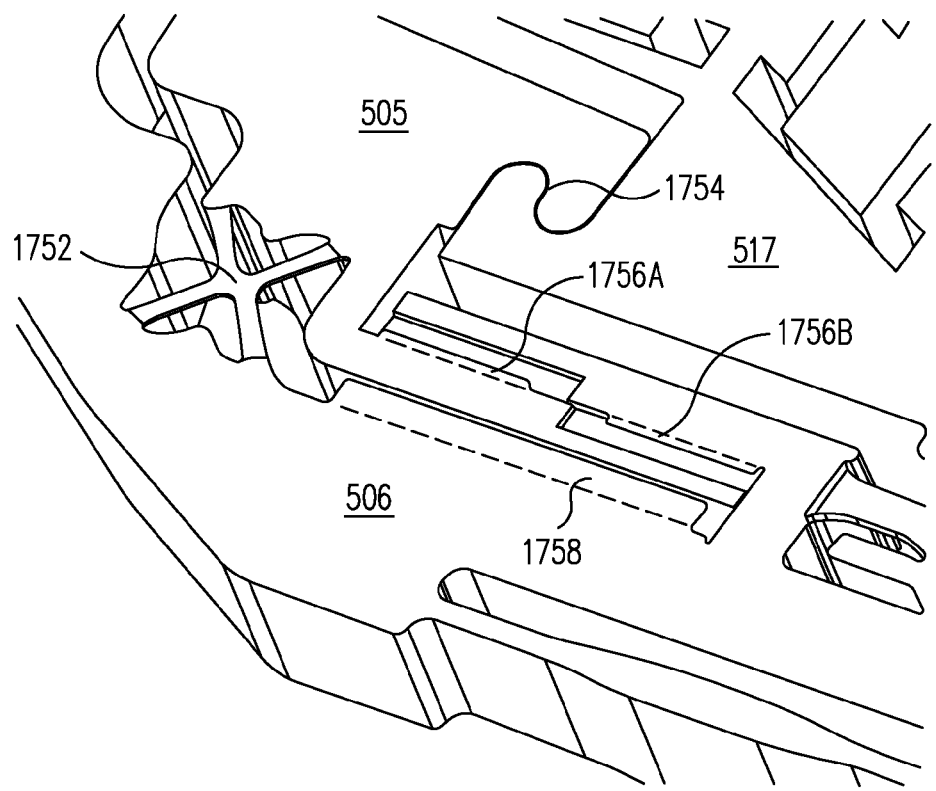
FIG. 17F illustrates an outer hinge flexure, a lateral snubber assembly, a single snubber flap and an interlocking snubber flaps feature of the actuator device, in accordance with an embodiment.
Figure 17G:
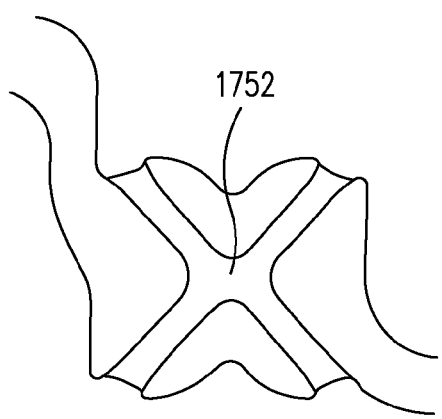
FIGS. 17G and 17H illustrate the outer hinge flexure, in accordance with an embodiment.
Figure 17H:
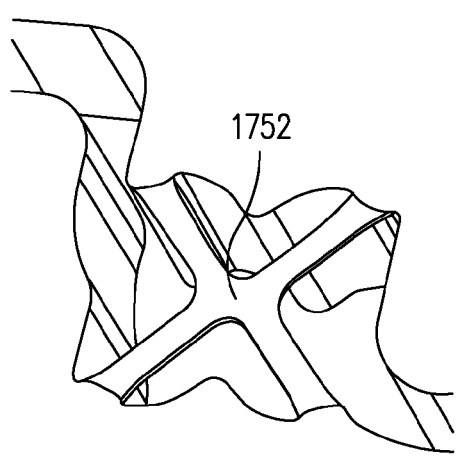
Figure 17I:
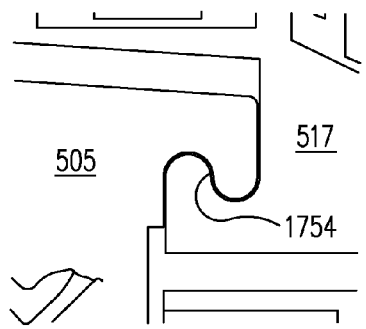
FIGS. 17I and 17J illustrate the lateral snubber assembly, in accordance with an embodiment.
Figure 17J:
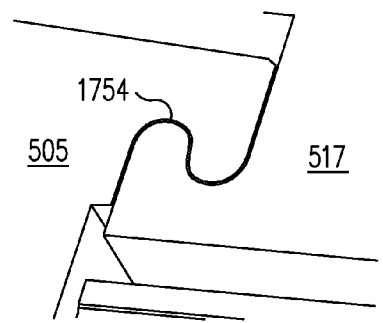

FIGS. 17D-17F illustrate an alternative embodiment of an interlocking snubber flaps feature 1756 useful for constraining both vertical movement of a component, e.g., moveable component 505, in the ±Z directions, as well as lateral movement thereof, i.e., in the ±X and/or ±Y directions. As may be seen in the cross-sectional views of FIGS. 17K, 17L and 17N, the structure of and methods for forming the interlocking flaps feature 1756 are similar to those of the interlocking flaps feature 5000 discussed above in connection with FIGS. 49-53.

As illustrated in FIG. 17F, this interlocking flaps feature includes the formation of a pair of flaps 1756A and 1756B respectively extending from moveable and fixed components 505 and 506 and over a corresponding shoulder 1762 formed on the other, opposing component. The flap 1756A on the moveable component 505 limits motion of the moveable component 505 in the −Z direction, and the flap 1756B on the fixed component 506 limits motion of the moveable component 505 in the +Z direction. Additionally, as illustrated in FIGS. 17K, 17L and 17N, the gap 1760 between the two components 505 and 506, which may be formed as discussed above in connection with FIGS. 49A-49F, may limit motion of the moveable component 505 in the ±X and/or ±Y directions.

Figure 17K:
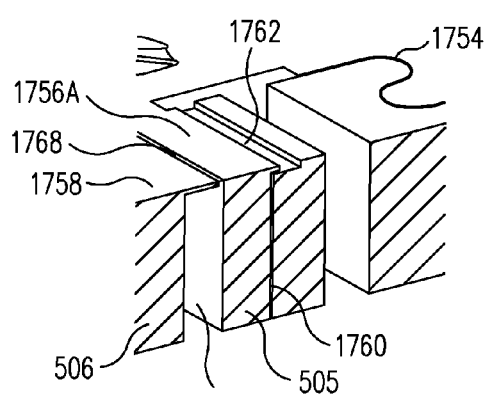
FIGS. 17K and 17L illustrate cross-sectional views of the single snubber flap and the interlocking snubber flaps, in accordance with an embodiment.
Figure 17L:
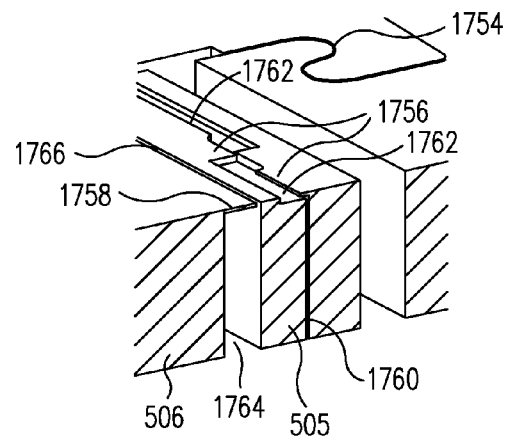
Figure 17M:
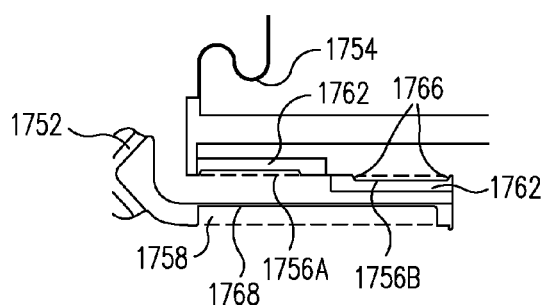
FIG. 17M illustrates a top view of the lateral snubber assembly, the single snubber flap and the interlocking snubber flaps, in accordance with an embodiment.

As illustrated in FIG. 17M, the respective front ends of the flaps 1756A and 1756B may define corners at the opposite ends thereof, and one or more of the corners may incorporate elliptical fillets 1766.

Figure 17N:
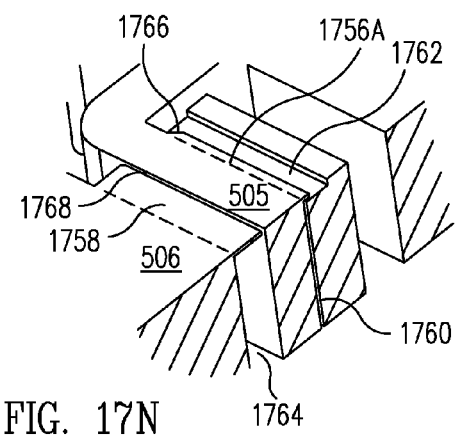
FIG. 17N illustrates cross-sectional views of the single snubber flap and the interlocking snubber flaps, in accordance with an embodiment.

As illustrated in FIGS. 17D-17L and FIGS. 17K-17N, a single snubber flap 1758 may be provided for constraining lateral movement of a component, e.g., moveable component 505, in an actuator device 1750. For example, the snubber flap 1758, which in some embodiments may comprise polysilicon, may extend from a fixed component, e.g., component 506, and toward but not over, the moveable component 505 to limit motion of the moveable component 505 in the lateral, i.e., in the in the ±X and/or ±Y directions. As illustrated in FIGS. 17K, 17L and 17N, the gap 1764 between the fixed and moveable components 505 and 506 can be made relatively larger than the gap 1768 between the snubber flap 1758 and the moveable component 505, such that the snubber flap 1758 does not interfere with normal rotational motion of the movable component 505, but does function to prevent unwanted lateral motion thereof.

Figure 18:
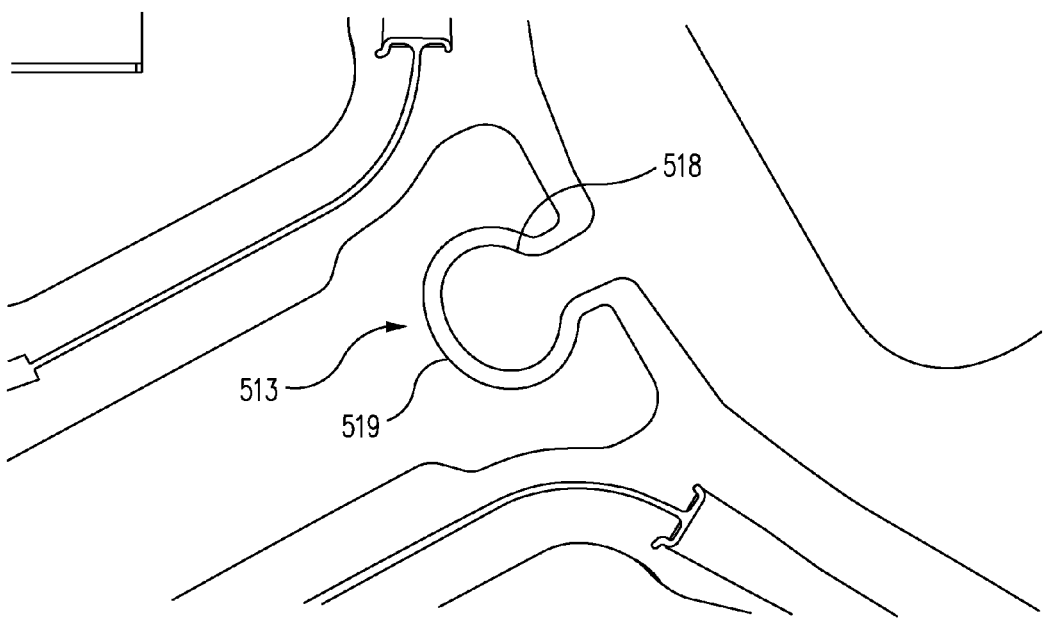
FIG. 18 illustrates a ball-in-socket snubber, in accordance with an embodiment.

FIG. 18 illustrates a ball-in-socket snubber 513, in accordance with an embodiment. The ball-in-socket snubber 513 may have a substantially cylindrical ball 518 that is slidably disposed within a substantially complimentary cylindrical socket 519. The ball-in-socket snubber 513 permit desired movement of the platform 520 with respect to the outer frame 506 and limit other movement.

Figure 19:
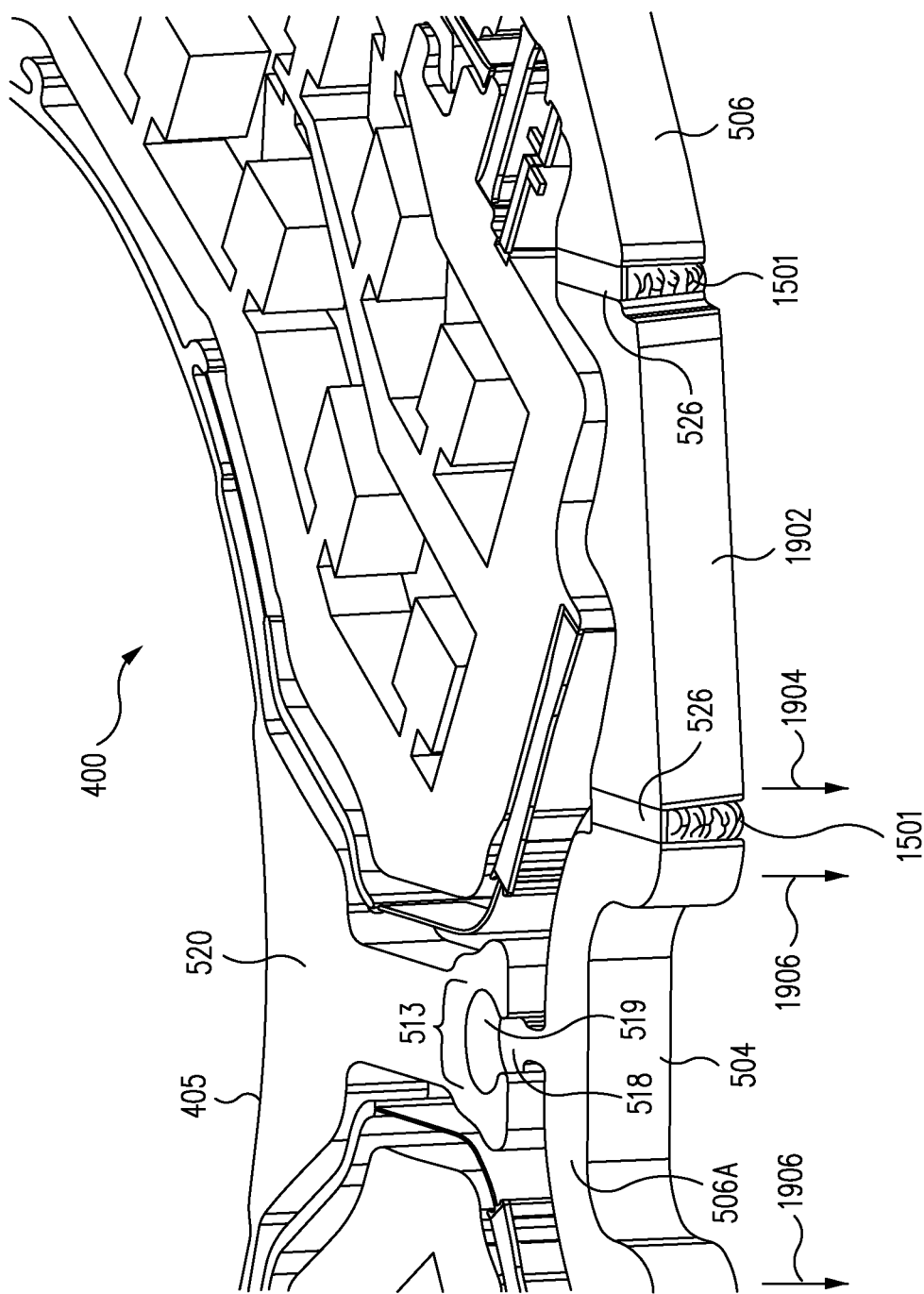
FIG. 19 illustrates the ball-in-socket snubber and two frame hinges, in accordance with an embodiment.

FIG. 19 illustrates a perspective view of the ball-in-socket 513 and two frame hinges 526, in accordance with an embodiment. The frame hinges 526 may be hinge flexures in the otherwise substantially rigid outer frame 506. The frame hinges 526 permit the outer frame 506 to deform out-of-plane while maintained desired rigidity in-plane.

Although the actuator disclosed herein is described as a MEMS actuator, such description is by way of example only and not by way of limitation. Various embodiments may include non-MEMS actuators, components of non-MEMS actuators, and/or features of non-MEMS actuators.

Thus, an actuator suitable for use in a wide variety of different electronic devices may be provided. Motion control of the actuator and/or items moved by the actuator may also be provided. As such, an enhanced miniature camera for use in electronic devices may be provided.

According to various embodiments, smaller size and enhanced shock resistance for miniature cameras are provided. Enhanced fabrication techniques may be used to provide these and other advantages. Thus, such fabrication techniques may additionally enhance the overall quality and reliability of miniature cameras while also substantially reducing the cost thereof.

Where applicable, the various components set forth herein may be combined into composite components and/or separated into sub-components. Where applicable, the ordering of various steps described herein may be changed, combined into composite steps, and/or separated into sub-steps to provide features described herein.

Embodiments described herein illustrate but do not limit the disclosure. It should also be understood that numerous modifications and variations are possible in accordance with the principles of the disclosure.

What is claimed is:

1. A device, comprising:
    a generally planar outer frame;
    a platform;
    a motion control mechanism adapted to permit movement of the platform in a plurality of directions relative to the outer frame; and
    an actuator contained at least partially within the motion control mechanism and operable to move the platform in a plurality of directions relative to the outer frame, including with translational movement in a direction substantially perpendicular to a plane defined by the outer frame, wherein the actuator comprises a movable frame, and wherein the motion control mechanism comprises a plurality of flexures configured to cooperate to provide a lateral stiffness and a rotational stiffness between the outer frame and the moveable frame and wherein the lateral stiffness is comparatively higher than the rotational stiffness.

2. The device as recited in claim 1, wherein the actuator is contained substantially entirely within the motion control mechanism such that increasing a size of the actuator results in increasing a size of the motion control mechanism.

3. The device as recited in claim 1, wherein the actuator and the motion control mechanism have a part in common such that increasing a size of the actuator results in increasing a size of the motion control mechanism.

4. The device as recited in claim 3,
    wherein the actuator and the motion control mechanism have the movable frame in common.

5. The device as recited in claim 1, wherein:
    the actuator comprises a fixed frame; and
    the plurality of flexures of the motion control mechanism comprise at least one torsional flexure and at least one hinge flexure cooperating to provide the lateral stiffness between the outer frame and the movable frame and cooperating to provide the rotational stiffness between the outer frame and the movable frame.

6. The device as recited in claim 5, wherein the at least one torsional flexure provides the lateral stiffness.

7. The device as recited in claim 5, wherein the at least one hinge flexure provides the rotational stiffness.

8. The device as recited in claim 5, wherein the at least one hinge flexure is X-shaped.

9. The device as recited in claim 5, wherein the motion control mechanism comprises a cantilever flexure interconnecting the movable frame and the platform.

10. The device as recited in claim 9, wherein the cantilever flexure is adapted to bend in a plurality of different directions.

11. The device as recited in claim 10, wherein the cantilever flexure is adapted to bend in one direction to accommodate a varying angle between the movable frame of the actuator and the platform and bend in a different direction to accommodate a varying distance between the movable frame of the actuator and the platform.

12. The device as recited in claim 1, wherein the actuator comprises a rotational comb actuator.

13. The device as recited in claim 1, wherein the platform is adapted to attach to an optical element.

14. An electronic device comprising the device of claim 1.

15. The device as recited in claim 1, further comprising:
an optical element attached to the platform for conjoint movement therewith.

16. A method, comprising:
forming a generally planar outer frame;
forming a platform;
forming a motion control mechanism adapted to permit movement of the platform in a plurality of directions relative to the outer frame; and
forming an actuator at least partially within the motion control mechanism, the actuator being operable move the platform in a plurality of directions relative to the outer frame, including with translational movement in a direction substantially perpendicular to a plane defined by the outer frame, wherein the actuator comprises a movable frame, and wherein the motion control mechanism comprises a plurality of flexures configured to cooperate to provide a lateral stiffness and a rotational stiffness between the outer frame and the moveable frame and wherein the lateral stiffness is comparatively higher than the rotational stiffness.

17. The method as recited in claim 16, wherein the outer frame, the platform, the motion control mechanism, and the actuator are of monolithic construction.

18. The method as recited in claim 16, wherein the outer frame, the platform, the motion control mechanism, and the actuator are formed by a MEMS process.

19. A method, comprising:
permitting movement of a platform in a plurality of directions relative to a generally planar outer frame;
moving the platform with translational movement in a direction substantially perpendicular to a plane defined by the outer frame with an actuator contained at least partially within a motion control mechanism;
bending a cantilever flexure in one direction to accommodate a varying angle between a movable frame of an actuator and the platform; and
bending the cantilever flexure in a different direction to accommodate a varying distance between the movable frame of the actuator and the platform.

20. The method as recited in claim 19, wherein the moving comprises moving a lens that is coupled to the platform along an optical axis of the lens.

21. The method as recited in claim 20, wherein the lens comprises a lens of a camera.

22. The method as recited in claim 21, wherein the camera comprises a miniature camera disposed in an electronic device.

* * * * *